(12) United States Patent
Kawamoto et al.

(10) Patent No.: US 7,579,973 B2
(45) Date of Patent: Aug. 25, 2009

(54) ANALOG-TO-DIGITAL CONVERTER

(75) Inventors: Akira Kawamoto, Kyoto (JP); Shou Shimada, Kyoto (JP)

(73) Assignee: Panasonic Corporation, Osaka (JP)

( * ) Notice: Subject to any disclaimer, the term of this patent is extended or adjusted under 35 U.S.C. 154(b) by 148 days.

(21) Appl. No.: 11/878,499

(22) Filed: Jul. 25, 2007

(65) Prior Publication Data

US 2008/0266158 A1 Oct. 30, 2008

(30) Foreign Application Priority Data

Aug. 3, 2006 (JP) .............................. 2006-211907

(51) Int. Cl.
*H03M 1/12* (2006.01)

(52) U.S. Cl. ...................................... 341/155; 341/156
(58) Field of Classification Search ................. 341/155, 341/120, 118, 131, 139, 164, 157
See application file for complete search history.

(56) References Cited

U.S. PATENT DOCUMENTS

| 4,893,124 | A | * | 1/1990 | Tsuji et al. .................. 341/156 |
| 5,691,821 | A | * | 11/1997 | Hieda et al. .............. 348/217.1 |
| 7,068,205 | B1 | * | 6/2006 | Hastings et al. .............. 341/164 |
| 2002/0017929 | A1 | * | 2/2002 | Garrett et al. ............... 327/108 |
| 2005/0057387 | A1 | | 3/2005 | Janakiraman et al. | |

FOREIGN PATENT DOCUMENTS

JP 09-055658 2/1997

* cited by examiner

*Primary Examiner*—Rexford N Barnie
*Assistant Examiner*—Joseph Lauture
(74) *Attorney, Agent, or Firm*—McDermott Will & Emery LLP

(57) ABSTRACT

An analog-digital (A-D) converter for outputting a digital signal corresponding to an analog input signal includes: an upper bit A-D converting section for conducting A-D conversion of the analog input signal and outputting an upper bit portion of the digital signal; a lower bit A-D converting section for conducting A-D conversion of the analog input signal and outputting a lower bit portion of the digital signal; and a majority circuit for sampling an A-D conversion result of the lower bit A-D converting section a plurality of times and determining a value of each of the lower bits by majority operation.

5 Claims, 18 Drawing Sheets

ANALOG-TO-DIGITAL CONVERTER

CROSS REFERENCE TO RELATED APPLICATION

This application claims priority under 35 U.S.C. §119 on Patent Application No. 2006-211907 filed in Japan on Aug. 3, 2006, the entire contents of which are hereby incorporated by reference.

BACKGROUND OF THE INVENTION

1. Field of the Invention

The invention relates to an analog-to-digital converter for outputting a digital signal corresponding to an analog signal.

2. Description of the Prior Art

When an analog-to-digital converter (hereinafter, also referred to as an A-D converter) converts an analog signal to a digital signal, conversion accuracy may be degraded by an external factor (noise). In order to remove the influence of noise of an input analog signal, a known A-D converter samples an analog data signal an even number of times at intervals equal to a half of a period of an alternating current component superimposing on the analog signal, and adds the sampling results (for example, Japanese Patent Laid-Open Publication No. 9-55658).

Noise removal of this A-D converter is effective for noise that superimposes on an input analog signal, but is not effective when noise is generated within the A-D converter.

SUMMARY OF THE INVENTION

The invention is made in view of the above problem, and it is an object of the invention to provide an A-D converter that is capable of performing A-D conversion without degrading conversion accuracy even when noise is generated within the A-D converter.

In order to achieve this object, according to one aspect of the invention, an A-D converter for outputting a digital signal corresponding to an analog input signal includes: an upper bit A-D converting section for conducting A-D conversion of the analog input signal and outputting an upper bit portion of the digital signal; a lower bit A-D converting section for conducting A-D conversion of the analog input signal and outputting a lower bit portion of the digital signal; and a majority circuit for sampling an A-D conversion result of the lower bit A-D converting section a plurality of times and determining a value of each of the lower bits by majority operation.

DETAILED DESCRIPTION OF THE PREFERRED EMBODIMENTS

Figure 1:
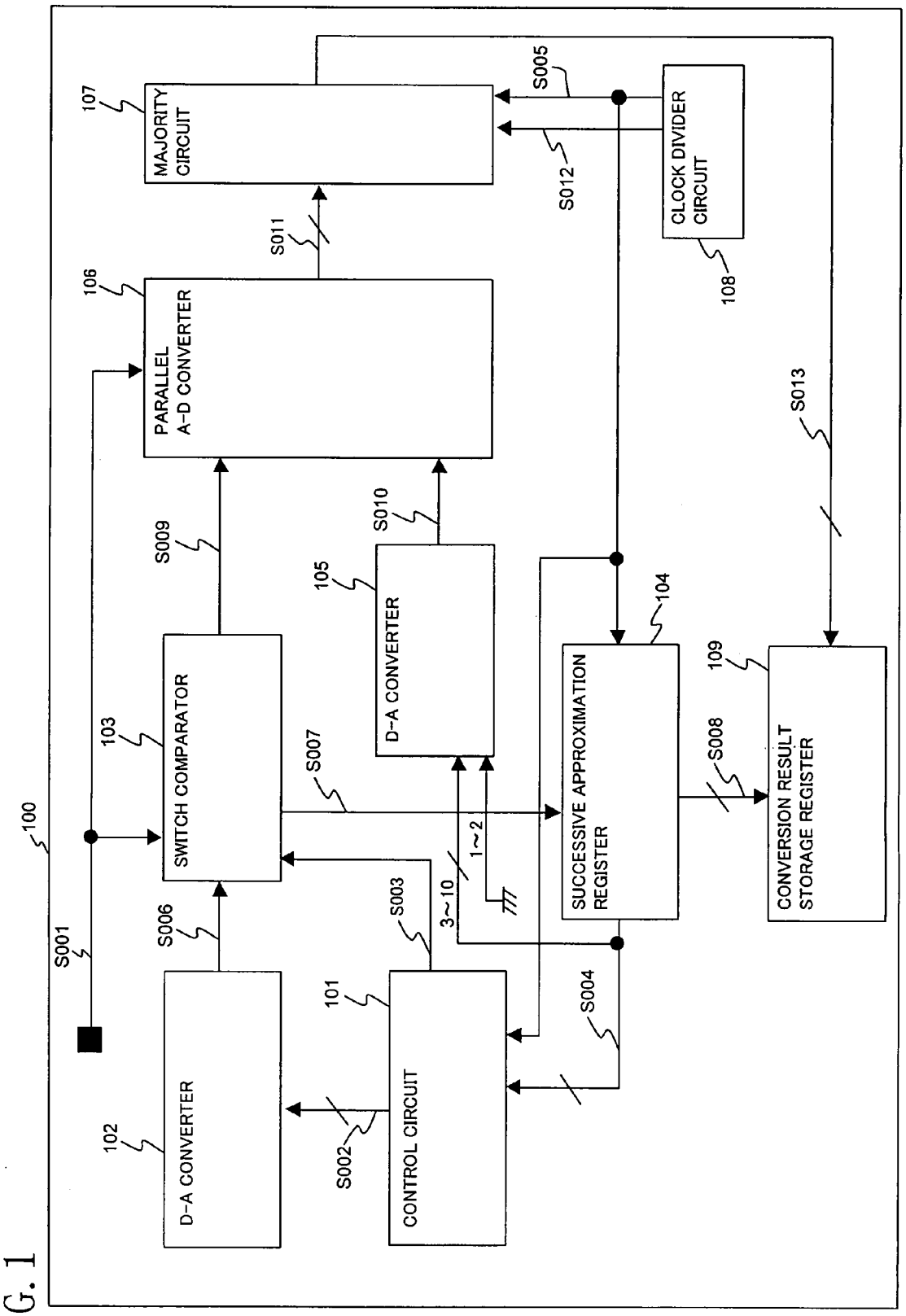
FIG. 1 is a block diagram showing the structure of an analog-to-digital (A-D) converter according to a first embodiment of the invention.

Hereinafter, embodiments of the invention will be described with reference to the accompanying drawings. It should be noted that, in the following embodiments, elements having the same functions will be denoted with the same reference numerals and characters, and description thereof will not be repeated.

First Embodiment

FIG. 1 is a block diagram showing the structure of an analog-to-digital (A-D) converter 100 according to a first embodiment of the invention. The A-D converter 100 is a device for converting an analog input signal S001 to a digital signal corresponding to the analog input signal S001. As shown in FIG. 1, the A-D converter 100 includes a control circuit 101, a digital-to-analog (D-A) converter 102, a switch comparator 103, a successive approximation register 104, a D-A converter 105, a parallel A-D converter 106, a majority circuit 107, a clock divider circuit 108, and a conversion result storage register 109.

Of the above elements, a circuit formed by the control circuit 101, the D-A converter 102, the switch comparator 103, and the successive approximation register 104 has two operation modes: a first operation mode and a second operation mode. In the first operation mode, the circuit operates as a successive approximation A-D converter (which will be described below). In the second operation mode, the circuit outputs digital data for generating a reference voltage for the parallel A-D converter 106 (i.e., outputs data for a reference voltage). The operation mode switches in a prescribed cycle.

Hereinafter, each of the elements will be described.

(Control Circuit 101)

The control circuit 101 controls operation of elements such as the switch comparator 103 according to the two operation modes. More specifically, the control circuit 101 generates a digital control signal S002 having a different value depending on the operation mode, and outputs the digital control signal S002 to the D-A converter 102.

The control circuit 101 also generates a digital control signal S003 that rises to a logic value "1" in a prescribed cycle (which will be described below), and outputs the digital control signal S003 to the switch comparator 103. It should be noted that the values of lower bits of the digital control signal S002 switch according to the digital control signal S003. In this embodiment, when the digital control signal S003 has a logic value "0," the digital control signal S002 is a signal that is output from the successive approximation register 104 (i.e., a digital signal S004). When the digital control signal S003 has a logic value "1," the digital control signal S002 is a digital signal S004 having each of its lower two bits replaced with "1."

Figure 2:
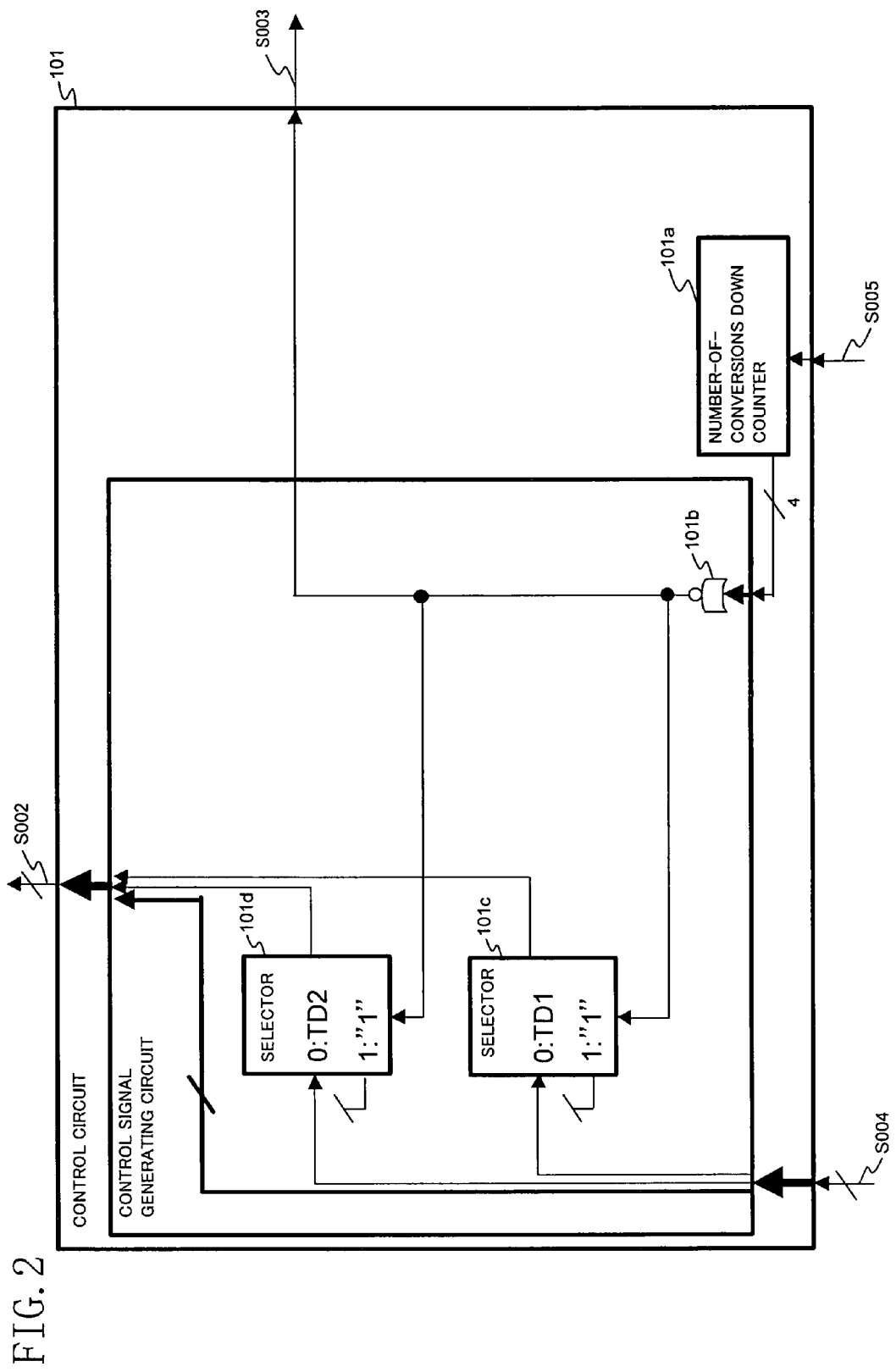
FIG. 2 is a block diagram showing an example of the structure of a control circuit 101.

For example, the control circuit 101 may be formed as shown in FIG. 2. In the example of FIG. 2, the control circuit 101 includes a number-of-conversions down counter 111a, a NOR circuit 101b, and selectors 101c, 101d.

The number-of-conversions down counter 101a is a 4-bit down counter for counting down in response to a rise of a clock signal S005. The initial value of the number-of-conversions down counter 101a is "0110." More specifically, the number-of-conversions down counter 110a counts down from 6 to 0, and outputs a 4-bit count result.

The NOR circuit 101b receives a count result (4 bits) from the number-of-conversions down counter 101a. The output of the NOR circuit 101b (the digital control signal S003) rises to "1" in such a cycle that the number-of-conversions down counter 110a outputs "0."

The selector 101c selects either "1" or the least significant bit of the digital signal S004 according to the output of the NOR circuit 101b. More specifically, the selector 101c outputs "1" when the output of the NOR circuit 101b is "1." The selector 101c outputs the least significant bit of the digital signal S004 when the output of the NOR circuit 101b is "0." The selector 101d selects either "1" or the second least significant bit of the digital signal S004 according to the output of the NOR circuit 101b. More specifically, the selector 101d outputs "1" when the output of the NOR circuit 101b is "1." The selector 101d outputs the second least significant bit of the digital signal S004 when the output of the NOR circuit 101b is "0."

(D-A converter 102)

The D-A converter 102 converts the digital control signal S002 to an analog signal and output the analog signal.

(Switch Comparator 103)

The switch comparator 103 operates according to the digital control signal S003. More specifically, depending on the digital control signal S003, the switch comparator 103 outputs the output of the D-A converter 102 (a D-A output voltage S006) to the parallel A-D converter 106, or outputs the comparison result of the analog input signal S001 and the D-A output voltage S006 (a comparator output S007) to the successive approximation register 104.

Figure 3:
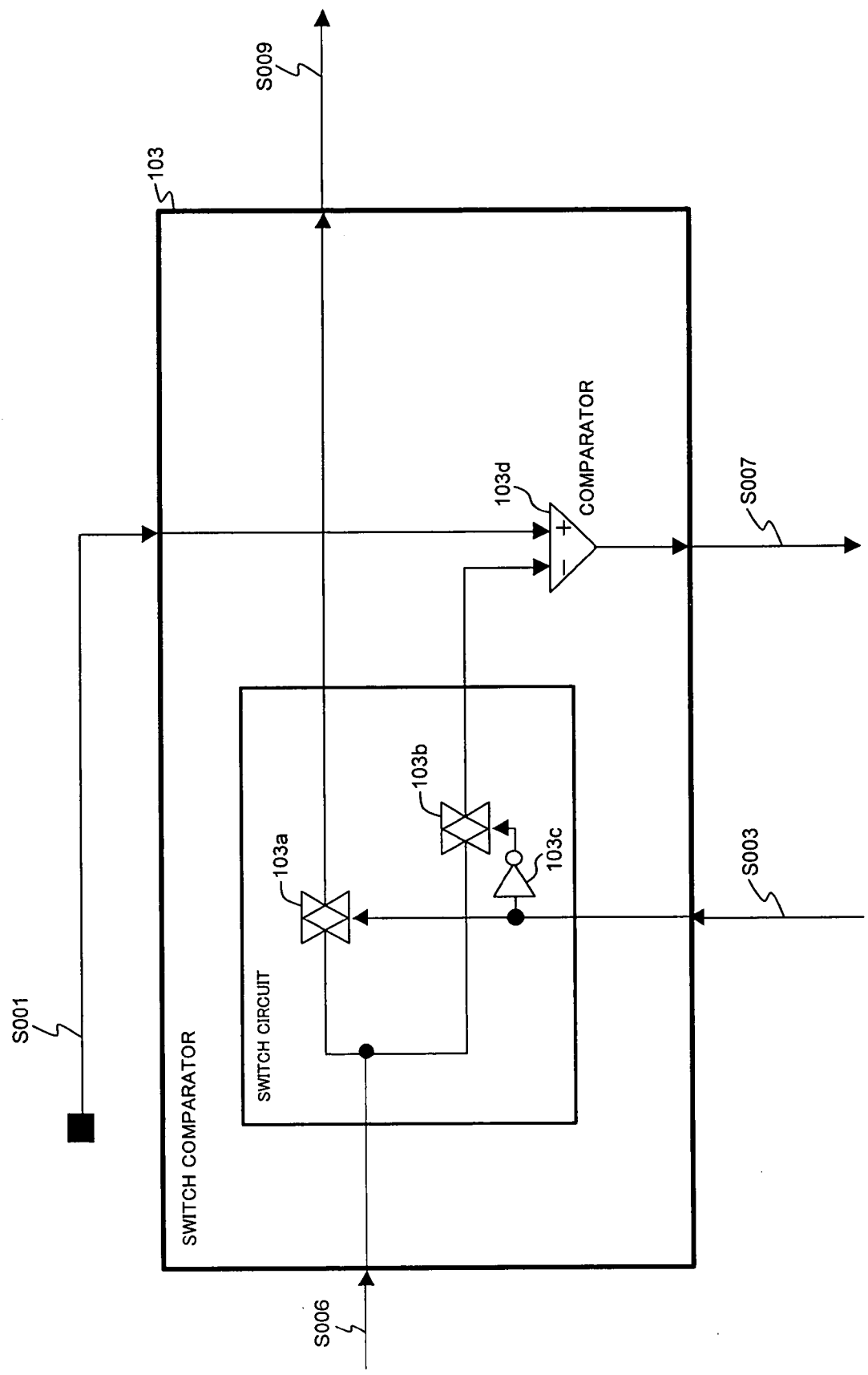
FIG. 3 is a block diagram showing an example of the structure of a switch comparator 103.

For example, the switch comparator 103 may be formed as shown in FIG. 3. In the example of FIG. 3, the switch comparator 103 includes an analog switch 103a, an analog switch 103b, a NOT circuit 103c, and a comparator 103d. The analog switch 103a, the analog switch 103b, and the NOT circuit 103c form a switch circuit. When the digital control signal S003 is "1," this switch circuit applies the D-A output voltage S006 to the parallel A-D converter 106 through the analog switch 103a. When the digital control signal S003 is "0," the switch circuit applies the D-A output voltage S006 to an inverted input terminal (−) of the comparator 103d through the analog switch 103b.

The analog input signal S001 is applied to a non-inverted input terminal (+) of the comparator 103d, and the comparator 103d outputs the voltage comparison result of the D-A output voltage S006 and the analog input signal S001 (the comparator output S007). More specifically, when the voltage of the analog input signal S001 is higher than the D-A output voltage S006, the comparator 103d outputs a comparator output S007 of "1." When the voltage of the analog input signal S001 is equal to or lower than the D-A output voltage S006, the comparator 103d outputs a comparator output S007 of "0."

(Successive Approximation Register 104)

The successive approximation register 104 operates in synchronization with a clock signal S005, and changes the value of its output (a digital signal S004) according to the comparator output S007. More specifically, when the comparator input S007 is "1" (when the voltage of the analog input signal S001 is higher than the D-A output voltage S006), the successive approximation register 104 increases the digital signal S004 to a value higher than a current value. When the comparator input S007 is "0" (when the voltage of the analog input signal S001 is equal to or lower than the D-A output voltage S006), the successive approximation register 104 reduces the digital signal S004 to a value smaller than a current value. The successive approximation register 104 also retrieves upper bits of the digital signal S004 and outputs the retrieved upper bits to the conversion result storage register 109. In this embodiment, the digital signal S004 is a 10-bit signal, and the successive approximation register 104 outputs upper eight bits of the digital signal S004 (an upper bit signal S008) to the conversion result storage register 109.

The control circuit 101, the D-A converter 102, the switch comparator 103, and the successive approximation register 104 are herein collectively referred to as an upper-bit A-D converting section.

(D-A Converter 105)

The D-A converter 105 converts a received digital signal to an analog signal. In this embodiment, "0" is applied to first and second bits of the D-A converter 105, and upper eight bits of the digital signal S004 are applied to third to tenth bits of the D-A converter 105.

(Parallel A-D Converter 106: Lower-Bit A-D Converting Section)

The parallel A-D converter 106 converts (A-D converts) an analog input signal S001 to a digital signal (in this embodiment, a 2-bit digital signal) by using an output of the switch comparator 103 (a first reference voltage S009) and an output of the D-A converter 105 (a second reference voltage S010) as reference voltages.

(Majority Circuit 107)

The majority circuit 107 reads (samples) an output of the parallel A-D converter 106 (a digital signal S011) a prescribed number of times, and performs a majority operation on each bit of the output of the parallel A-D converter 106. By the majority operation, the majority circuit 107 determines whether each bit is "0" or "1," and outputs the result to the conversion result storage register 109.

Figure 4:
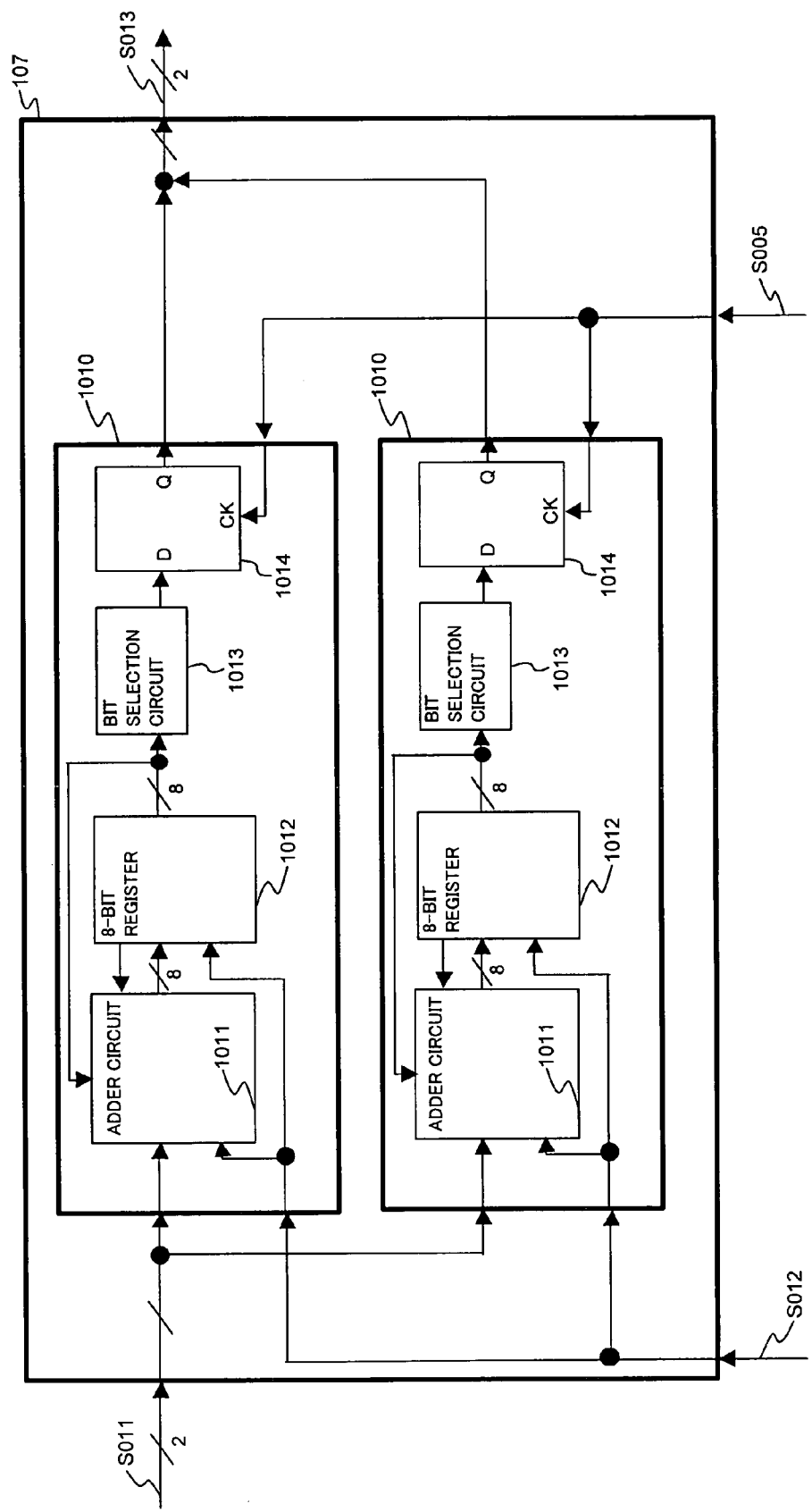
FIG. 4 is a block diagram showing an example of the structure of a majority circuit 107.

For example, the majority circuit 107 may be formed as shown in FIG. 4. In the example of FIG. 4, the majority circuit 107 includes two single-bit majority circuits 1010 for performing a majority operation on a bit-by-bit basis and determining whether each bit is "0" or "1." A first bit of the digital signal S011 is applied to one of the single-bit majority circuits 1010, and a second bit of the digital signal S011 is applied to the other single-bit majority circuit 1010.

Each single-bit majority circuit 1010 includes an adder 1011, an 8-bit register 1012, a bit selection circuit 1013, and a flip-flop 1014.

In response to a rise of a clock signal S012, the adder 1011 adds a value (one bit) of the digital signal S011 and a value stored in the 8-bit register 1012, and stores the sum in the 8-bit register 1012.

The 8-bit register 1012 operates in synchronization with the clock signal S012.

The bit selection circuit 1013 stores data of a third bit of the 8-bit register 1012 in the flip-flop 1014 in response to a rise of a clock signal S005.

The flip-flop 1014 retains an output of the bit selection circuit 1013 in response to a rise of the clock signal S005.

(Clock Divider Circuit 108)

The clock divider circuit 108 generates clock signals S012, S005. In this embodiment, the frequency ratio of the clock signal S012 to the clock signal S005 is determined so that an output of the flip-flop 1014 is retained after the adder 1011 performs addition seven times.

In other words, by this frequency ratio, the single-bit majority circuit 1010 outputs "1" when four or more of seven reading (sampling) operation results is "1."

(Conversion Result Storage Register 109)

The conversion result storage register 109 stores an upper bit signal S008 and an output of the majority circuit 107 (a lower bit signal S013). The conversion result storage register 109 is a 10-bit register that stores the upper bit signal S008 in upper eight bits and stores the lower bit signal S013 in lower two bits.

(Operation of the A-D Converter 100)

After the number-of-conversions down counter 101a of the control circuit 101 starts counting down, a logic value of the digital control signal S003 remains "0" while a count value of the number-of-conversions down counter 101a is 1 or more.

While the logic value of the digital control signal S003 is "0," the control circuit 101 outputs a digital signal S004 to the D-A converter 102 as a digital control signal S002. The D-A converter 102 D-A converts the digital signal S004 (the digital control signal S002) and outputs the resultant signal to the switch comparator 103 as a D-A output voltage S006.

In the switch comparator 103, the analog switch 103b is turned ON, and the D-A output voltage S006 is applied to the comparator 103d. The comparator 103d compares an analog input signal S001 with the D-A output voltage S006, and outputs a comparator output S007 to the successive approximation register 104. When the comparator output S007 is "1," the successive approximation register 104 increases the digital signal S004 to a value larger than a current value. When the comparator output S007 is "0," the successive approximation register 104 reduces the digital signal S004 to a value smaller than a current value. Moreover, the successive approximation register 104 outputs upper eight bits of the digital signal S004 to the conversion result storage register 109.

While the logic value of the digital control signal S003 is "0," the control circuit 101, the D-A converter 102, the switch comparator 103, and the successive approximation register 104 operate as described above in synchronization with a clock signal S005. As a result, upper eight bits of a signal resulting from A-D conversion of the analog input signal S001 are stored in the conversion result storage register 109. In other words, while the logic value of the digital control signal S003 is "0," the circuit formed by the control circuit 101, the D-A converter 102, the switch comparator 103, and the successive approximation register 104 operates as a successive approximation A-D converter.

When the count value of the number-of-conversions down counter 101a becomes "0000," the logic value of the digital control signal S003 rises to "1." When the logic value of the digital control signal S003 rises to "1," the control circuit 101 outputs the digital signal S004 having each of its lower two bits replaced with "1" to the D-A converter 102 as a digital control signal S002. The D-A converter 102 D-A converts the received signal, and outputs the resultant signal to the switch comparator 103.

In the comparator switch 103, the analog switch 103a is turned ON, and a D-A output voltage S006 is applied to the parallel A-D converter 106 as a first reference voltage S009. "0" is applied to the lower first and second bits of the D-A converter 105, and upper eight bits of the digital signal S004 are applied to the third to tenth bits of the D-A converter 105. The D-A converter 105 converts the received digital signal to an analog signal, and outputs the resultant analog signal to the parallel A-D converter 106 as a second reference voltage S010.

The parallel A-D converter 106 converts the analog input signal S001 to a digital signal based on the first reference voltage S009 and the second reference voltage S010, and outputs the resultant digital signal to the majority circuit 107. The first reference voltage S009 is a signal produced by converting the analog input signal S001 to a digital signal, replacing each of lower two bits of the resultant digital signal with "1," and converting the resultant signal to an analog signal. The second reference voltage S010 is a signal produced by converting the analog input signal S001 to a digital signal, replacing each of lower two bits of the resultant digital signal with "1," and converting the resultant signal to an analog signal. Accordingly, the digital signal S011 corresponds to the lower two bits of the signal resulting from A-D conversion of the analog input signal S001.

The majority circuit 107 reads (samples) the output of the parallel A-D converter 106 seven times in synchronization with a clock signal S012, and performs a majority operation on each bit of the output of the parallel A-D converter 106. By the majority operation, the majority circuit 107 determines whether each bit is "0" or "1," and outputs the result to the conversion result storage register 109. The conversion result storage register 109 thus stores 10-bit data resulting from A-D conversion of the analog input signal S001, that is, two bits from the majority circuit 107 and upper eight bits from the successive approximation register 104.

As described above, in this embodiment, the lower two bits of data resulting from A-D conversion of the analog input signal S001 are obtained by converting the analog input signal into a digital signal a plurality of times and performing a majority operation on the resultant digital signals. In other words, reliability of lower bits that are susceptible to noise can be improved by using majority operation. Moreover, the influence of noise can be reduced even when the noise is generated within the A-D converter 100.

Second Embodiment

Figure 5:
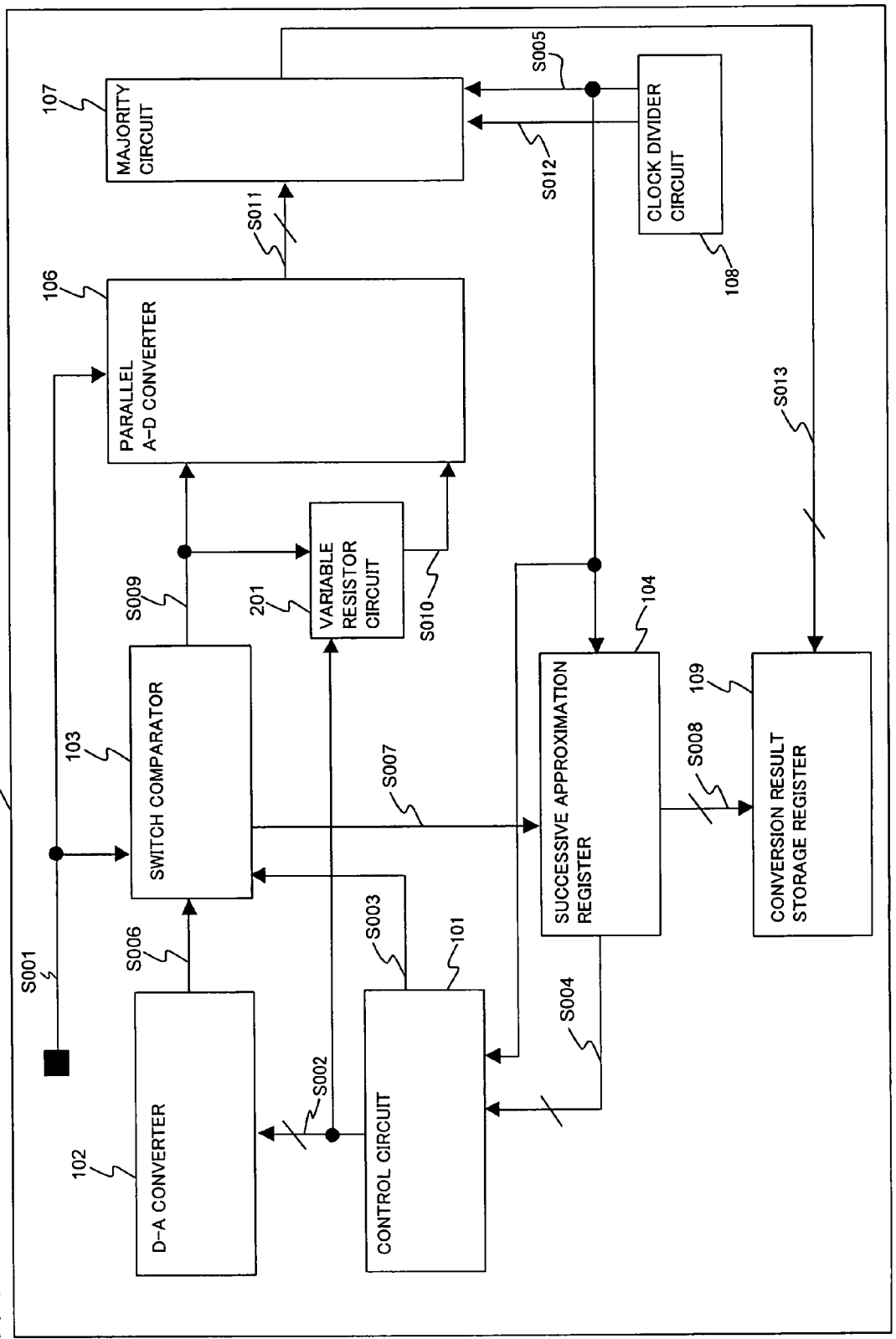
FIG. 5 is a block diagram showing the structure of an A-D converter according to a second embodiment of the invention.

FIG. 5 is a block diagram showing the structure of an analog-to-digital (A-D) converter 200 according to a second embodiment of the invention. As shown in FIG. 5, the A-D converter 200 is the same as the A-D converter 100 of the first embodiment except that the D-A converter 105 of the A-D converter 100 is replaced with a variable resistor circuit 201 shown in FIG. 6.

Figure 6:
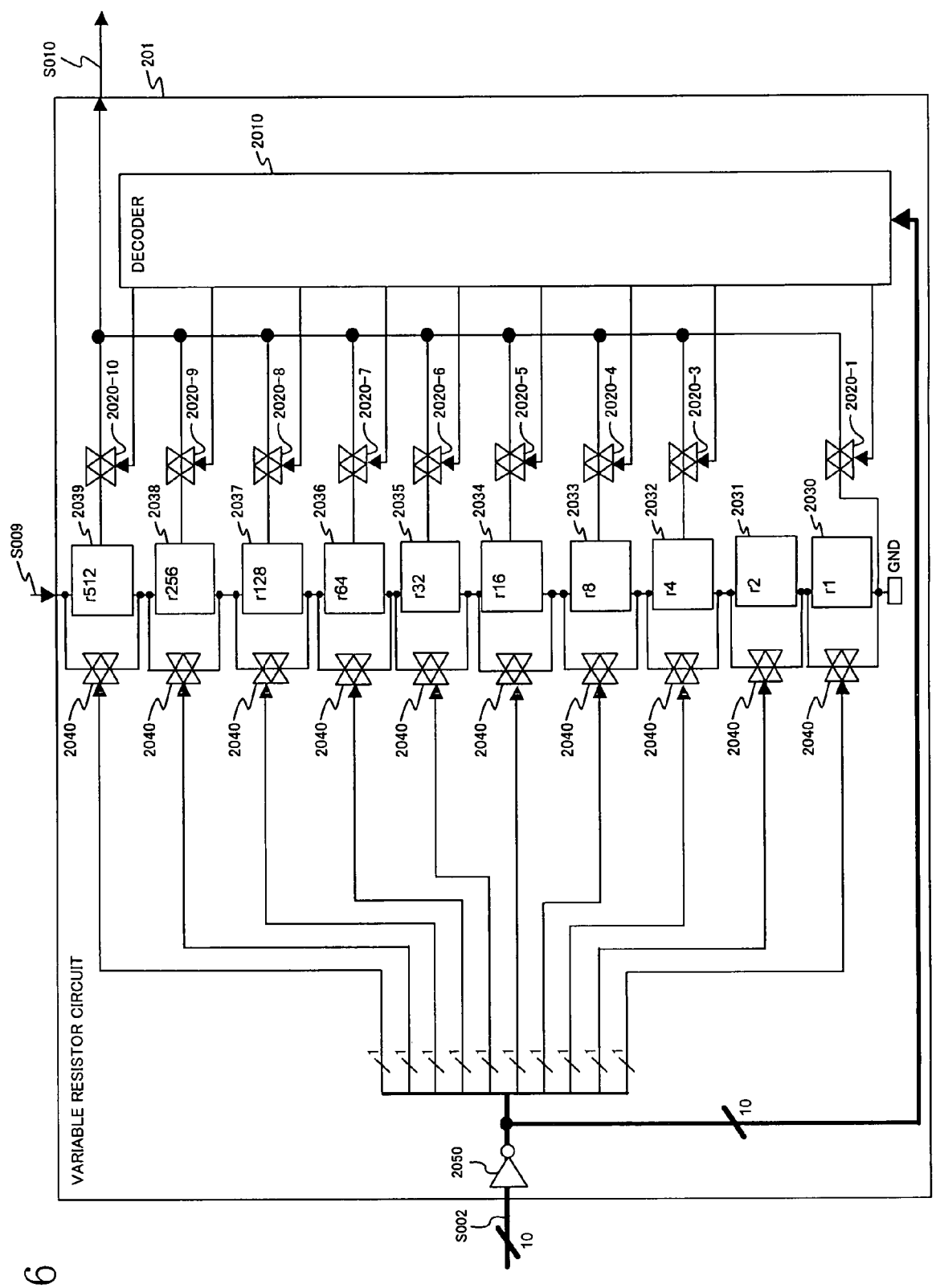
FIG. 6 is a block diagram showing an example of the structure of a variable resistor circuit 201.

The variable resistor circuit 201 produces a second reference voltage S010 by dividing a first reference voltage S009 based on a digital control signal S002. More specifically, as shown in FIG. 6, the variable resistor circuit 201 includes a decoder 2010, nine analog switches 2020 (2020-1, 2020-3, ..., 2020-10), ten resistor circuits 2030 through 2039, ten analog switches 2040, and a NOT circuit 2050.

According to an output signal of the NOT circuit 2050 (a 10-bit signal as described below), the decoder 2010 outputs a control signal to each analog switch 2020 to turn ON/OFF each analog switch 2020. More specifically, when the most significant bit of the bits of a value "1" in the output signal of the NOT circuit 2050 is bit n, the decoder 2010 outputs a control signal of "1" to the analog switch 2020-n (where n=1, 3, ..., 10).

The analog switch 2020 is turned ON when the control signal received from the decoder 2010 is "1."

The resistor circuits 2030 through 2039 have different resistance values and are connected in series with each other. In this embodiment, the resistance values of the resistor circuits 2030 through 2039 are 1Ω, 2Ω, 4Ω, 8Ω, 16Ω, 32Ω, 64Ω, 128Ω, 256Ω, and 512Ω, respectively. In FIG. 6, the resistor circuits 2030 through 2039 are denoted by "r1" and the like according to their resistance values (for example, "r1" indicates the 1Ω resistor circuit 2030). The analog switches 2020 are connected to the resistor circuits 2030 through 2039 except the resistor circuit 2031, respectively.

The resistor circuit 2030 is formed from a single 1Ω resistor, and one end of the analog switch 2020-1 is connected between the resistor circuit 2030 and the ground GND. The resistor circuit 2031 is formed from a single 2Ω resistor. The resistor circuit 2032 is formed from series connection of a 3Ω resistive element and a 1Ω resistive element, and one end of the analog switch 2020-3 is connected between the resistive elements. The resistor circuit 2033 is formed from series connection of a 3Ω resistive element and a 5Ω resistive element, and one end of the analog switch 2020-4 is connected between the resistive elements. The resistor circuit 2034 is formed from series connection of a 3Ω resistive element and a 13Ω resistive element, and one end of the analog switch 2020-5 is connected between the resistive elements. The resistor circuit 2035 is formed from series connection of a 3Ω resistive element and a 29Ω resistive element, and one end of the analog switch 2020-6 is connected between the resistive elements. The resistor circuit 2036 is formed from series connection of a 3Ω resistive element and a 61Ω resistive element, and one end of the analog switch 2020-7 is connected between the resistive elements. The resistor circuit 2037 is formed from series connection of a 3Ω resistive element and a 125Ω resistive element, and one end of the analog switch 2020-8 is connected between the resistive elements. The resistor circuit 2038 is formed from series connection of a 3Ω resistive element and a 253Ω resistive element, and one end of the analog switch 2020-9 is connected between the resistive elements. The resistor circuit 2039 is formed from series connection of a 3Ω resistive element and a 509Ω resistive element, and one end of the analog switch 2020-10 is connected between the resistive elements.

The analog switches 2020 are connected together at their respective other ends (i.e., at the terminals that are not connected to the corresponding resistive elements) to output a second reference voltage S010.

The analog switches 2040 are turned ON when a received control signal is "1."

Each bit of a logically inverted signal of the digital control signal S002 is applied to a corresponding analog switch 2040 in order to turn ON/OFF of the analog switches 2040.

Each analog switch 2040 is connected to both ends of a corresponding resistor circuit so as to bypass the resistor circuit.

The NOT circuit 2050 outputs a logically inverted signal (10 bits) of the digital control signal S002.

With the above structure, the variable resistor circuit 201 produces a second reference voltage S010 that is lower than the first reference voltage S009 by a prescribed amount. Accordingly, the second reference voltage S010 that is output from the variable resistor circuit 201 can also be used as a reference voltage for A-D conversion of the analog input signal S001. Moreover, the circuit size of the variable resistor circuit 201 can be made smaller than that of the D-A converter 105 of the first embodiment.

Third Embodiment

In a third embodiment, an analog-to-digital (A-D) converter capable of changing the bit length of lower bits to be used for majority operation to any number of bits from one to three will be described.

Figure 7:
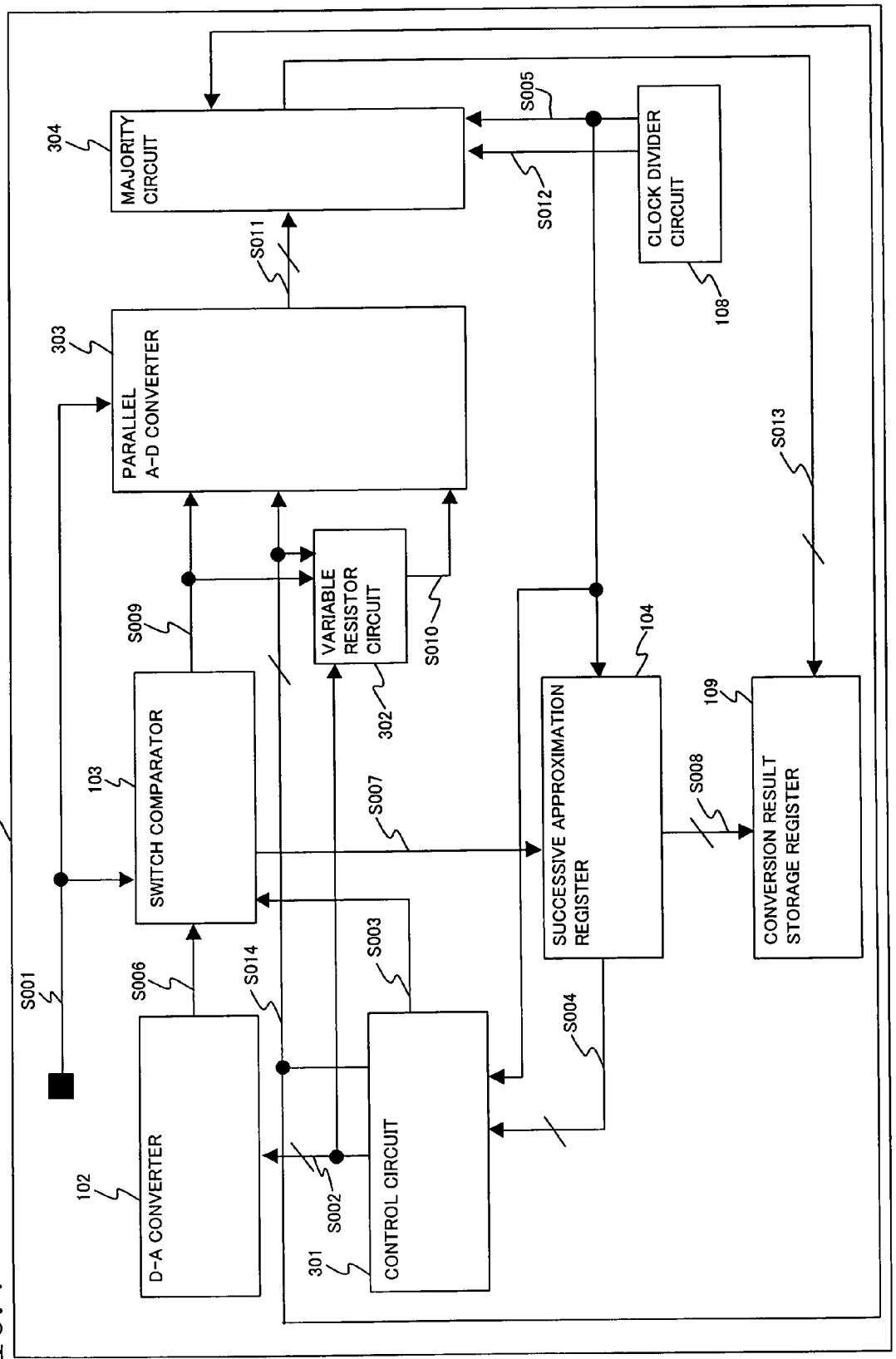
FIG. 7 is a block diagram showing the structure of an A-D converter according to a third embodiment of the invention.

FIG. 7 is a block diagram showing the structure of an A-D converter 300 according to the third embodiment of the invention. As shown in FIG. 7, the A-D converter 300 is the same as the A-D converter 200 of the second embodiment except that the control circuit 101, the variable resistor circuit 201, the parallel A-D converter 106, and the majority circuit 107 are replaced with a control circuit 301, a variable resistor circuit 302, a parallel A-D converter 303, and a majority circuit 304, respectively.

(Structure of the Control Circuit 301)

Figure 8:
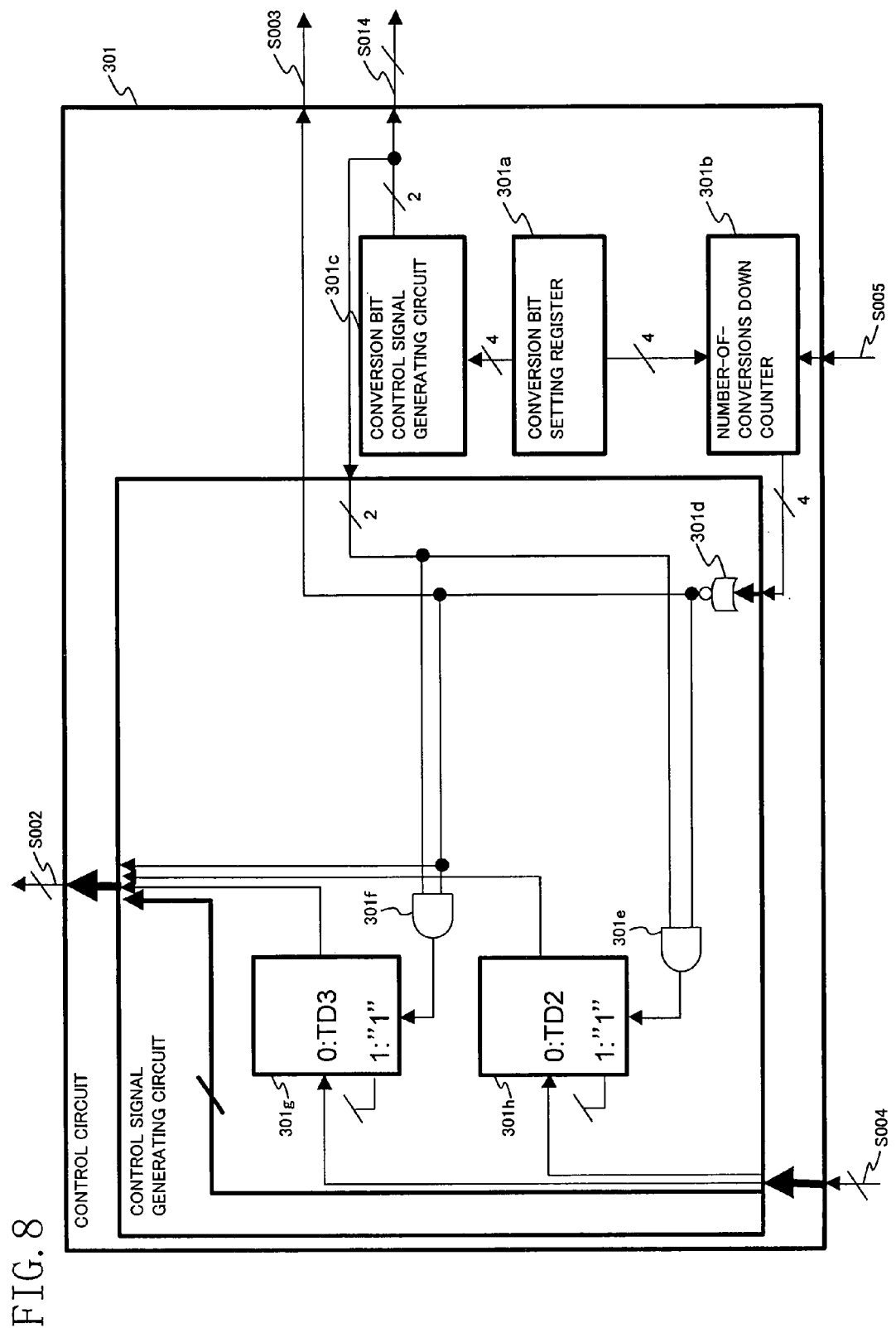
FIG. 8 is a block diagram showing an example of the structure of a control circuit 301.

The control circuit 301 controls operation of the switch comparator 103. In addition, the control circuit 301 produces a digital control signal S002 to be applied to the D-A converter 102, and produces a control signal S014 for controlling the variable resistor circuit 302, the parallel A-D converter 303, and the majority circuit 304. For example, the control circuit 301 may be formed as shown in FIG. 8. In the example of FIG. 8, the control circuit 301 includes a conversion bit setting register 301a, a number-of-conversions down counter 301b, a conversion bit control signal generating circuit 301c, a NOR circuit 301d, AND circuits 301e, 301f, and selectors 301g, 301h.

The conversion bit setting register 301a is a 4-bit register, and is referred to by the number-of-conversions down counter 301b and the conversion bit control signal generating circuit 301c. In this embodiment, one of the following values is stored in the conversion bit setting register 301a: "0101"; "0111"; and "1000."

The number-of-conversions down counter 301b is a 4-bit down counter for counting down in response to a rise of a clock signal S005. More specifically, the number-of-conversions down counter 301b reads a value stored in the conversion bit setting register 301a, counts down the read value to zero, and outputs a 4-bit count result.

The conversion bit control signal generating circuit 301c outputs a control signal S014 having a value according to the value stored in the conversion bit setting register 301a. More specifically, when the value of the conversion bit setting register 301a is "0101," the conversion bit control signal generating circuit 301c outputs a control signal S014 of "11." When the value of the conversion bit setting register 301a is "0111," the conversion bit control signal generating circuit 301c outputs a control signal S014 of "01." When the value of the conversion bit setting register 301a is "1000," the conversion bit control signal generating circuit 301c outputs a control signal S014 of "00."

The NOR circuit 301d receives a count result (4 bits) of the number-of-conversions down counter 301b. The NOR circuit 301b outputs a digital control signal S003. Therefore, the digital control signal S003 is "0" except when the output of the number-of-conversions down counter 301b is "0000."

The AND circuits 301e, 301f both receive the digital control signal S003 and the control signal S014.

The selector 301g selects either "1" or the third least significant bit of the digital signal S004 according to the output of the AND circuit 301f. More specifically, the selector 301g outputs "1" when the output of the AND circuit 301f is "1," and outputs the third least significant bit of the digital signal S004 when the output of the AND circuit 301f is "0."

The selector 301h selects either "1" or the second least significant bit of the digital signal S004 according to the output of the AND circuit 301e. More specifically, the selector 301h outputs "1" when the output of the AND circuit 301e is "1," and outputs the second least significant bit of the digital signal S004 when the output of the AND circuit 301e is "0."

(Structure of the Variable Resistor Circuit 302)

Figure 9:
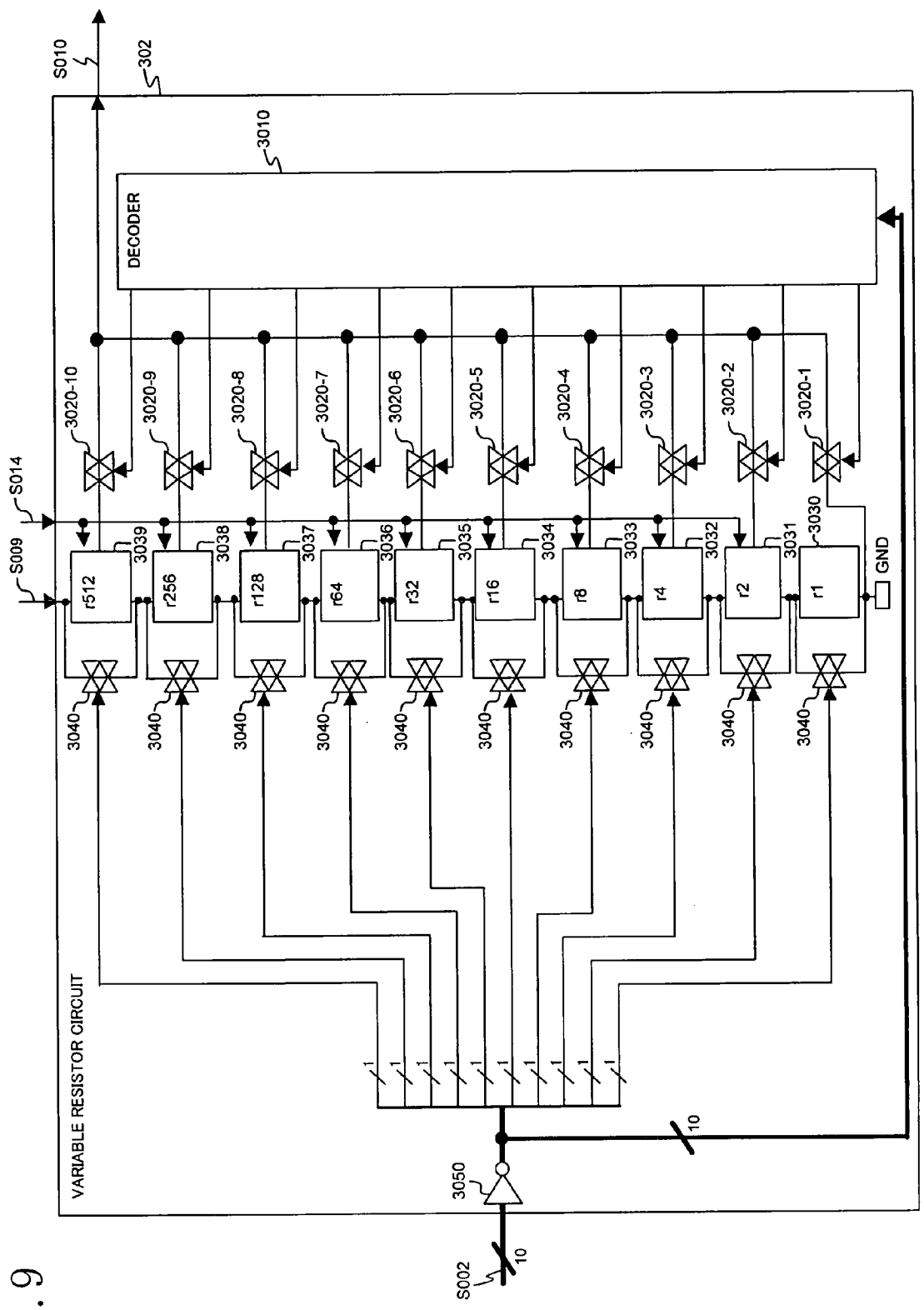
FIG. 9 is a block diagram showing an example of the structure of a variable resistor circuit 302.

The variable resistor circuit 302 produces a second reference voltage S010 by dividing a first reference voltage S009 based on a digital control signal S002 and a control signal S014. More specifically, as shown in FIG. 9, the variable resistor circuit 302 includes a decoder 3010, ten analog switches 3020 (3020-1 through 3020-10), ten resistor circuits 3030 through 3039, ten analog switches 3040, and a NOT circuit 3050.

According to an output signal of the NOT circuit 3050 (a 10-bit signal as described below), the decoder 3010 outputs a control signal to each analog switch 3020 to turn ON/OFF each analog switch 3020. More specifically, when the most significant bit of the bits of a value "1" in the output signal of the NOT circuit 3050 is bit n, the decoder 3010 outputs a control signal of "1" to the analog switch 3020-n (where n=1, . . . , 10).

The analog switch 3020 is turned ON when the control signal received from the decoder 3010 is "1." The analog switches 3020 are connected together at their respective one ends to output a second reference voltage S010.

The resistor circuits 3030 through 3039 have different resistance values and are connected in series with each other. The resistance values of the resistor circuits 3030 through 3039 are 1Ω, 2Ω, 4Ω, 8Ω, 16Ω, 32Ω, 64Ω, 128Ω, 256Ω, and 512Ω, respectively. In FIG. 9, the resistor circuits 3030 through 3039 are denoted by "r1" and the like according to their resistance values (for example, "r1" indicates the 1Ω resistor circuit 3030). The analog switches 3020 are connected to the resistor circuits 3030 through 3039, respectively. More specifically, the resistor circuit 3030 is formed from a single 1Ω resistor, and the analog switch 3020-1 is connected between the resistor circuit 3030 and the ground GND. The resistor circuit 3031 is formed from series connection of two 1Ω resistive elements, and a signal line is connected between the resistive elements. The resistor circuit 3032 is formed from series connection of a 1Ω resistive element, a 2Ω resistive element, and a 1Ω resistive element, and a signal line is connected between the resistive elements. The resistor circuit 3033 is formed from series connection of a 1Ω resistive element, a 2Ω resistive element, a 4Ω resistive element, and a 1Ω resistive element, and a signal line is connected between the resistive elements. The resistor circuit 3034 is formed from series connection of a 1Ω resistive element, a 2Ω resistive element, a 4Ω resistive element, and a 9Ω resistive element, and a signal line is connected between the resistive elements. The resistor circuit 3035 is formed from series connection of a 1Ω resistive element, a 2Ω resistive element, a 4Ω resistive element, and a 25Ω resistive element, and a signal line is connected between the resistive elements. The resistor circuit 3036 is formed from series connection of a 1Ω resistive element, a 2Ω resistive element, a 4Ω resistive element, and a 57Ω resistive element, and a signal line is connected between the resistive elements. The resistor circuit 3037 is formed from series connection of a 1Ω resistive element, a 2Ω resistive element, a 4Ω resistive element, and a 121Ω resistive element, and a signal line is connected between the resistive elements. The resistor circuit 3038 is formed from series connection of a 1Ω resistive element, a 2Ω resistive element, a 4Ω resistive element, and a 249Ω resistive element, and a signal line is connected between the resistive elements. The resistor circuit 3039 is formed from series connection of a 1Ω resistive element, a 2Ω resistive element, a 4Ω resistive element, and a 505Ω resistive element, and a signal line is connected between the resistive elements.

In each resistor circuit, one of the signal lines connected between the resistive elements is selected according to the control signal S014. More specifically, in the resistor circuits 3033 to 3039, the signal line connected between the 1Ω resistive element and the 2Ω resistive element is selected when the control signal S014 is "00." When the control signal S014 is "01," the signal line connected between the 2Ω resistive element and the 4Ω resistive element is selected. When the control signal S014 is "11," the signal line connected between the 4Ω resistive element and the remaining resistive element is selected. In the resistor circuit 3031, the signal line connected between the 1Ω resistive elements is selected when the control signal S014 is "00." In the resistor circuit 3032, the signal line connected between the 1Ω resistive element and the 2Ω resistive element is selected when the control signal S014 is "00." When the control signal S014 is "01," the signal connected between the 2Ω resistive element and the remaining resistive element is selected.

The analog switches 3040 are turned ON when a received control signal is "1." Each bit of a logically inverted signal of the digital control signal S002 is applied to a corresponding analog switch 3040 in order to turn ON/OFF of the analog switches 3040.

Each analog switch 3040 is connected to both ends of a corresponding resistor circuit so as to bypass the resistor circuit.

The NOT circuit 3050 outputs a logically inverted signal (10 bits) of the digital control signal S002.

(Structure of the Parallel A-D Converter 303)

The parallel A-D converter 303 converts an analog input signal S001 to a 1-bit, 2-bit, or 3-bit digital signal (a digital signal S011).

Figure 10:
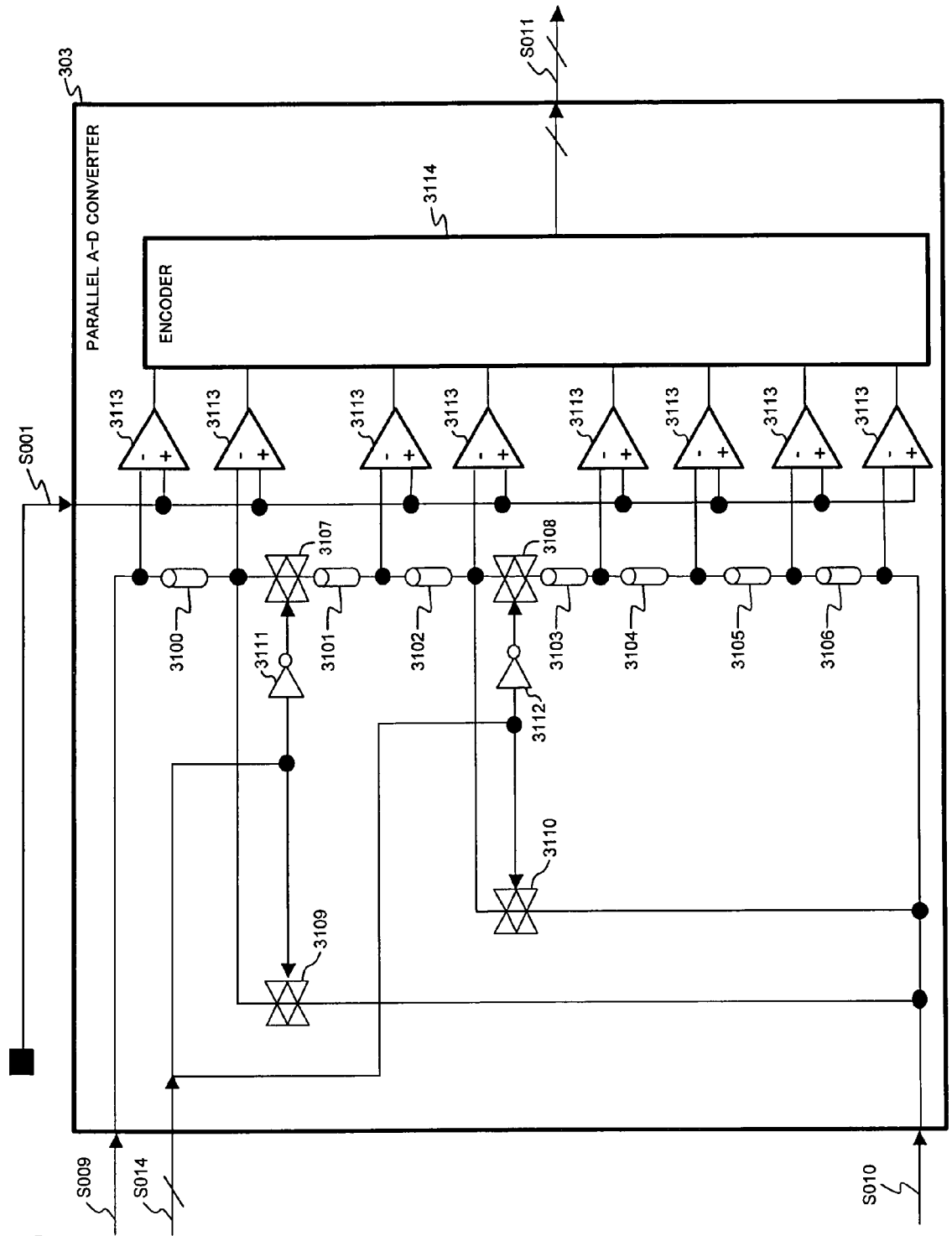
FIG. 10 is a block diagram showing an example of the structure of a parallel A-D converter 303.

For example, the parallel A-D converter 303 may be formed as shown in FIG. 10. In the example of FIG. 10, the parallel A-D converter 303 includes resistive elements 3100 through 3106, analog switches 3107 through 3110, NOT circuits 3111, 3112, eight operational-amplifier-type comparators 3113, and an encoder 3114.

As shown in FIG. 10, the resistive elements 3100 to 3106 are connected in series with each other through the analog switches 3107, 3108. A first reference voltage S009 is applied to one end of the resistive element 3100, and a second reference voltage S010 is applied to one end of the resistive element 3106.

The analog switches 3107, 3108 are turned ON/OFF according to a control signal S014 received through a corresponding NOT circuit (the NOT circuit 3111, 3112). The analog switches 3109, 3110 are turned ON/OFF according to a control signal S014. A second reference voltage S010 is applied to one end of the analog switch 3109, and the other end of the analog switch 3109 is connected to the junction of the resistive element 3100 and the analog switch 3017. The second reference voltage S010 is also applied to one end of the analog switch 3110, and the other end of the analog switch 3110 is connected to the junction of the resistive element 3102 and the analog switch 3108.

The operational-amplifier-type comparator 3113 outputs a signal having a logic value "1" when the signal level applied to its non-inverted input terminal (+) exceeds the signal level applied to its inverted input terminal (−). Otherwise, the operational-amplifier-type comparator 3113 outputs a signal having a logic value "0." More specifically, the inverted input terminal (−) of each operational-amplifier-type comparator 3113 is connected as shown in FIG. 10. An analog input signal S001 is applied to the non-inverted input terminal (+) of each operational-amplifier-type comparator 3113.

The encoder 3114 encodes an output signal of each operational-amplifier-type comparator 3113 into a 1-bit, 2-bit, or 3-bit digital signal S011.

In the parallel A-D converter 303, when the control signal S014 is "00," the analog switches 3107, 3108 are turned ON and the analog switches 3109, 3110 are turned OFF. Accordingly, the first reference voltage S009 and the second reference voltage S010 are divided and eight voltages are generated. In this case, the encoder 314 outputs a 3-bit digital signal.

When the control signal S014 is "01," the analog switches 3107, 3110 are turned ON, and the analog switches 3108, 3109 are turned OFF. Accordingly, the first reference voltage S009 and the second reference voltage S010 are divided and four voltages are generated. In this case, the encoder 3114 outputs a 2-bit digital signal.

When the control signal S014 is "11," the analog switches 3109, 3110 are turned ON, and the analog switches 3107, 3108 are turned OFF. Accordingly, the first reference voltage S009 and the second reference voltage S010 are divided and two voltages are generated. In this case, the encoder 3114 outputs a 1-bit digital signal.

(Structure of the Majority Circuit 304)

The majority circuit 304 reads (samples) an output of the parallel A-D converter 303 (a digital signal S011) a prescribed number of times, and performs a majority operation on each bit of the output of the parallel A-D converter 303. By the majority operation, the majority circuit 304 determines whether each bit is "0" or "1," and outputs to the conversion result storage register 109 a signal having a number of bits according to the control signal S014 (a lower bit signal S013).

Figure 11:
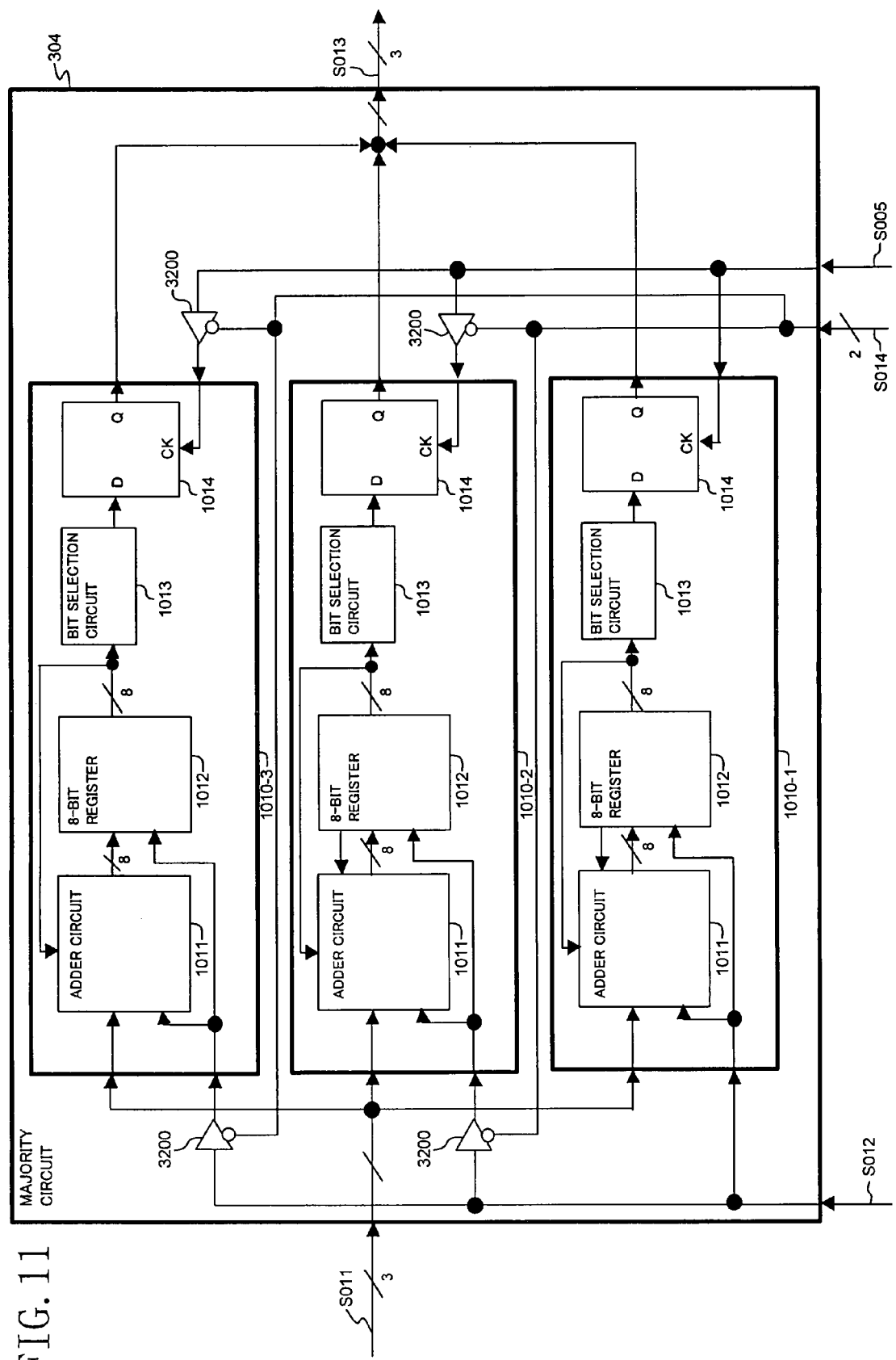
FIG. 11 is a block diagram showing an example of the structure of a majority circuit 304.

For example, the majority circuit 304 may be formed as shown in FIG. 11. In the example of FIG. 11, the majority circuit 304 has three single-bit majority circuits 1010 (single-bit majority circuits 1010-1 through 1010-3). In this embodiment, the least significant bit of the digital signal S011 is applied to the single-bit majority circuit 1010-1, the second least significant bit of the digital signal S011 is applied to the single-bit majority circuit 1010-2, and the third least significant bit of the digital signal S011 is applied to the single-bit majority circuit 1010-3.

In each single-bit majority circuit 1010, an adder 1011 and a flip-flop 1014 receive a clock signal directly from the clock divider circuit 108 or through a corresponding switch circuit 3200 that is controlled by a control signal S014.

When the control signal S014 is "00," clock signals S012, S005 are applied to the single-bit majority circuit 1010-1, and the single-bit majority circuit 1010-1 operates accordingly. However, the clock signals S012, S005 are not applied to the single-bit majority circuits 1010-2, 1010-3, and the single-bit majority circuits 1010-2, 1010-3 do not operate.

When the control signal S014 is "01," the clock signals S012, S005 are applied to the single-bit majority circuits 1010-1, 1010-2, and the single-bit majority circuits 1010-1, 1010-2 operate accordingly. However, the clock signals S012, S005 are not applied to the single-bit majority circuit 1010-3, and the single-bit majority circuit 1010-3 does not operate.

When the control signal S014 is "11," the clock signals S012, S005 are applied to the single-bit majority circuits 1010-1, 1010-2, 1010-3, and the single-bit majority circuits 1010-1, 1010-2, 1010-3 operate accordingly.

In other words, the majority circuit 304 outputs a 1-bit signal when the control signal S014 is "00," outputs a 2-bit signal when the control signal S014 is "01," and outputs a 3-bit signal when the control signal S014 is "11."

As described above, in this embodiment, the bit length of lower bits to be used for majority operation can be changed to any number of bits from one to three according to the value of the conversion bit setting register 301a. Accordingly, power consumption can be reduced by, for example, selecting the number of bits to be used for majority operation according to the level of noise.

Fourth Embodiment

In the fourth embodiment, an analog-to-digital (A-D) converter capable of changing the number of times a sampling operation is to be conducted for majority operation (that is, the number of sampling operations to be conducted for majority operation) will be described.

Figure 12:
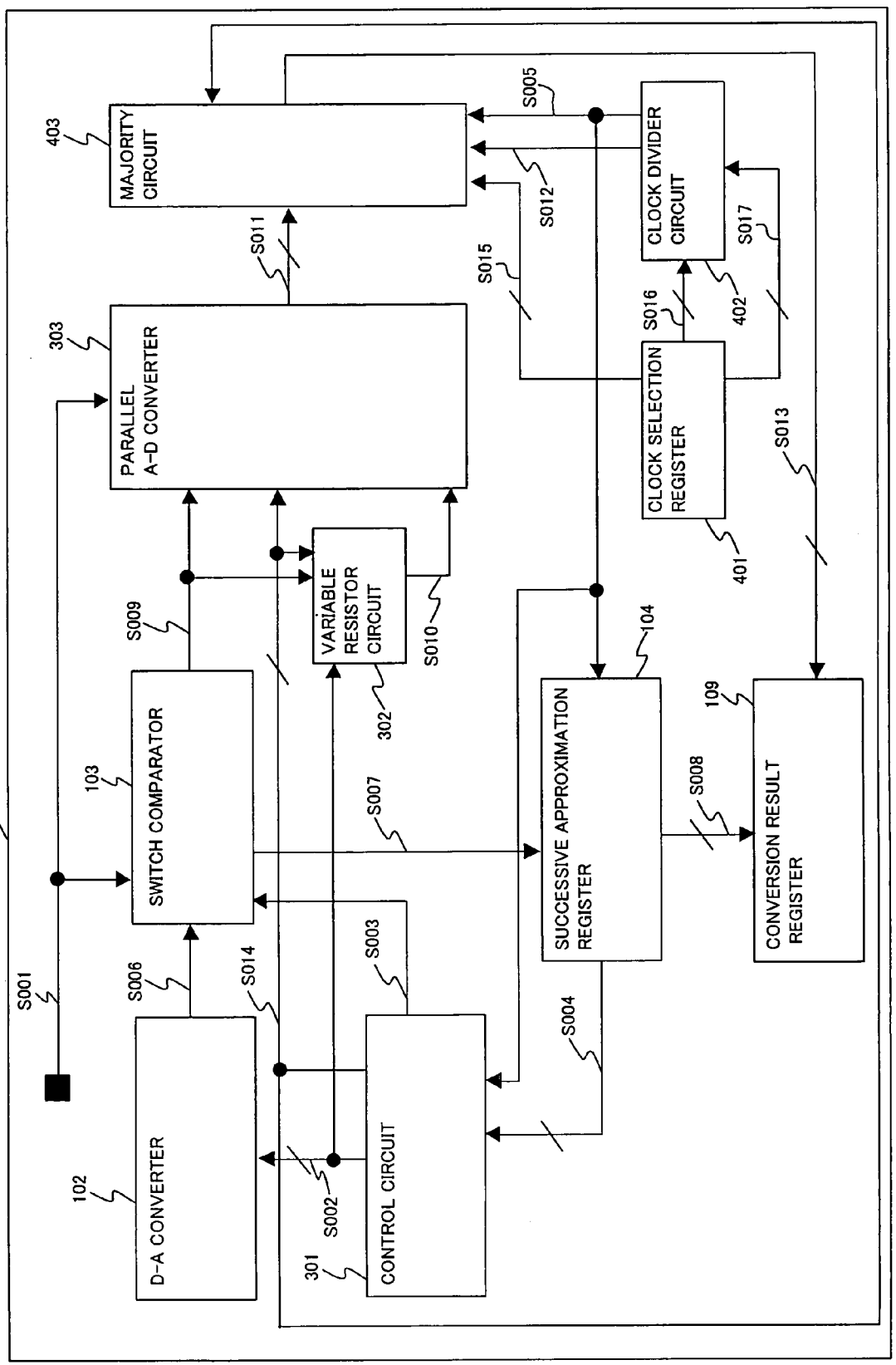
FIG. 12 is a block diagram showing the structure of an A-D converter according to a fourth embodiment of the invention.

FIG. 12 is a block diagram showing the structure of the A-D converter 400 according to the fourth embodiment of the invention. As shown in FIG. 12, the A-D converter 400 is the same as the A-D converter 300 of the third embodiment except that a clock selection register 401 is added, the clock divider circuit 108 is replaced with a clock divider circuit 402, and the majority circuit 304 is replaced with a majority circuit 403.

The clock selection register 401 is a register for storing information showing the number of sampling operations to be conducted for majority operation (number-of-sampling-operations information S015), information showing a frequency of a clock signal S012 (frequency information S016), and information showing a frequency of a clock signal S005 (frequency information S017).

The clock divider circuit 402 generates a clock signal S012 having a frequency according to the frequency information S016 and a clock signal S005 having a frequency according to the frequency information S017.

Figure 13:
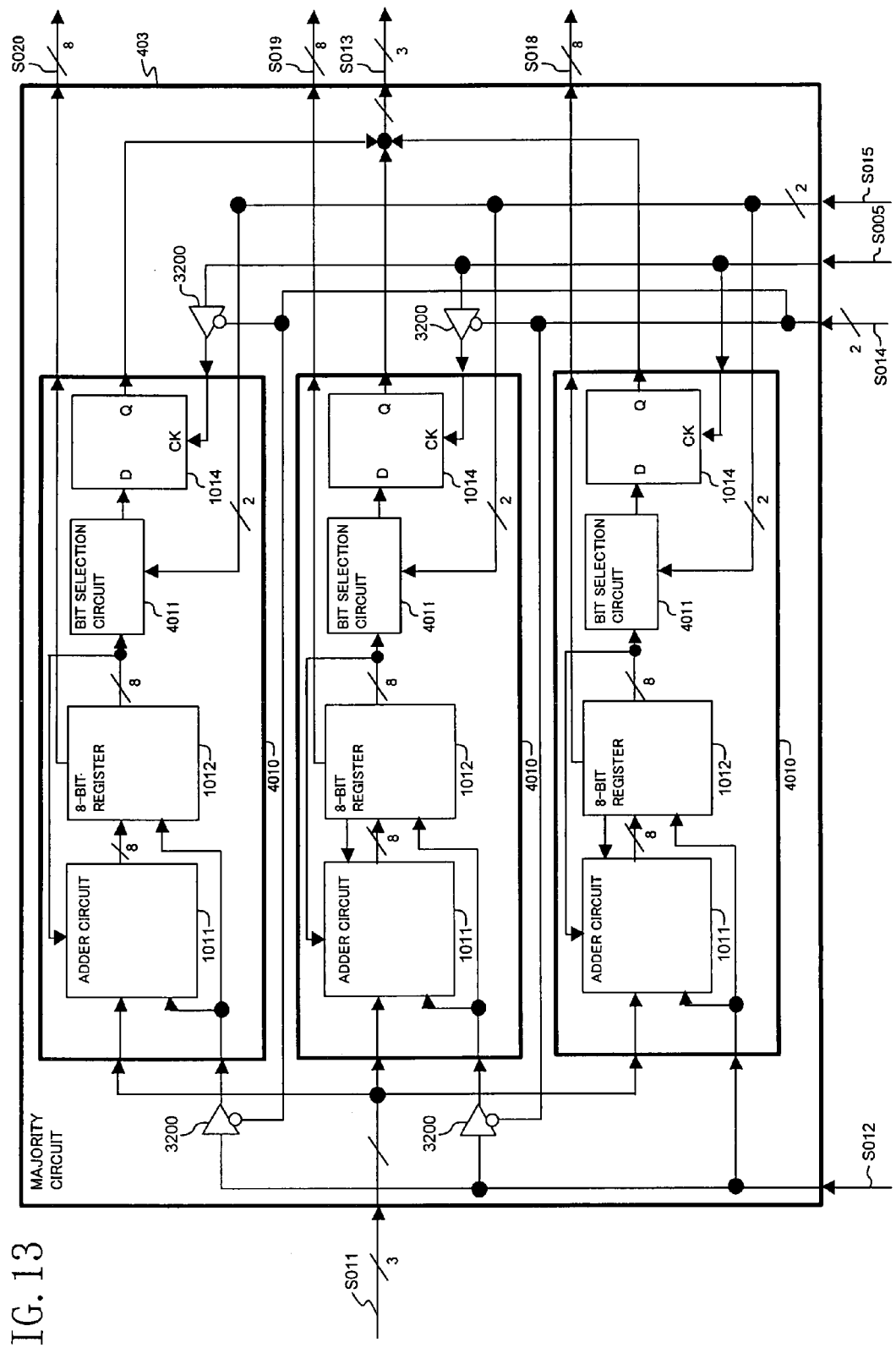
FIG. 13 is a block diagram showing an example of the structure of a majority circuit 403.

The majority circuit 403 performs majority operation by sampling a digital signal S011 the number of times according to the number-of-sampling-operations information S015, and outputs the majority operation result. For example, the majority circuit 403 may be formed as shown in FIG. 13. In the example of FIG. 13, the majority circuit 403 is the same as the majority circuit 304 of the third embodiment except that the single-bit majority circuits 1010 are replaced with single-bit majority circuits 4010. The single-bit majority circuits 4010 are the same as the single-bit majority circuits 1010 except that the bit selection circuit 1013 is replaced with a bit selection circuit 4011.

Each bit selection circuit 4011 outputs data of a prescribed bit of an 8-bit register 102 to a flip-flop 1014 in response to a rise of the clock signal S005. In this case, the bit selection circuit 4011 determines which bit of the 8-bit register 1012 is to be stored according to the number-of-sampling-operations information S015. It should be noted that although the majority circuit 403 outputs the respective values of the 8-bit registers 1012 as sums S018, S019, S020, these signals are not used in this embodiment.

As described above, in this embodiment, the number of sampling operations to be conducted for majority operation can be changed according to the value stored in the clock selection register 401. Accordingly, power consumption can be reduced by, for example, selecting the number of times to perform a majority operation according to the type of noise.

Fifth Embodiment

In a fifth embodiment, an analog-to-digital (A-D) converter capable of automatically changing the number of times a sampling operation is to be conducted for majority operation (that is, the number of sampling operations to be conducted for majority operation) so that a stable majority operation result is obtained will be described.

Figure 14:
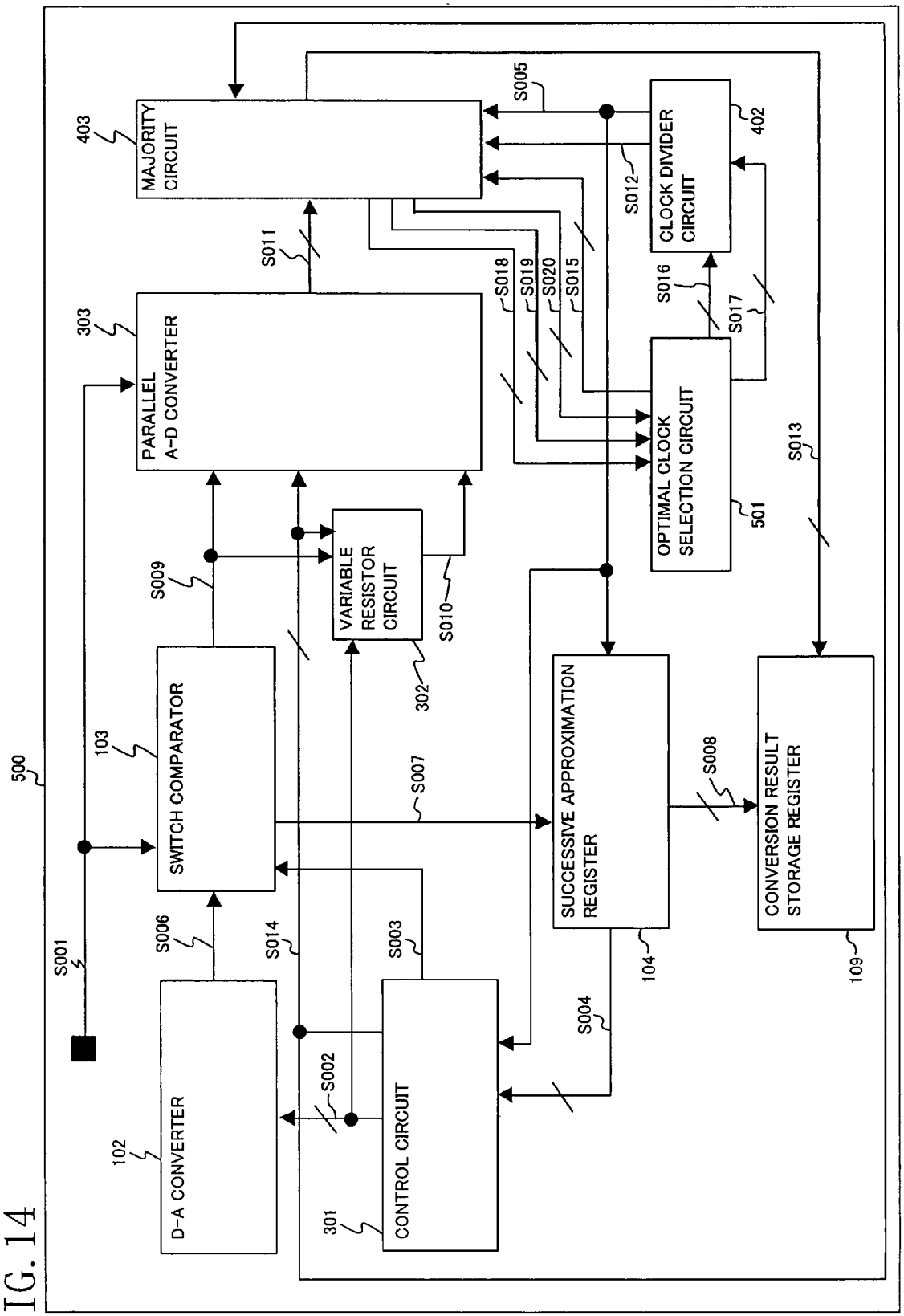
FIG. 14 is a block diagram showing the structure of an A-D converter according to a fifth embodiment of the invention.

FIG. 14 is a block diagram showing the structure of an A-D converter 500 according to the fifth embodiment of the invention. As shown in FIG. 14, the A-D converter 500 is the same as the A-D converter 400 except that the clock selection register 401 is replaced with an optimal clock selection circuit 501.

The optimal clock selection circuit 501 determines the respective frequencies of clock signals S012, S005 (i.e., the number of sampling operations to be conducted for majority operation) so that the majority accounts for a prescribed proportion or more in the majority operation. For example, the optimal clock selection circuit 501 may be formed as shown in FIG. 15.

Figure 15:
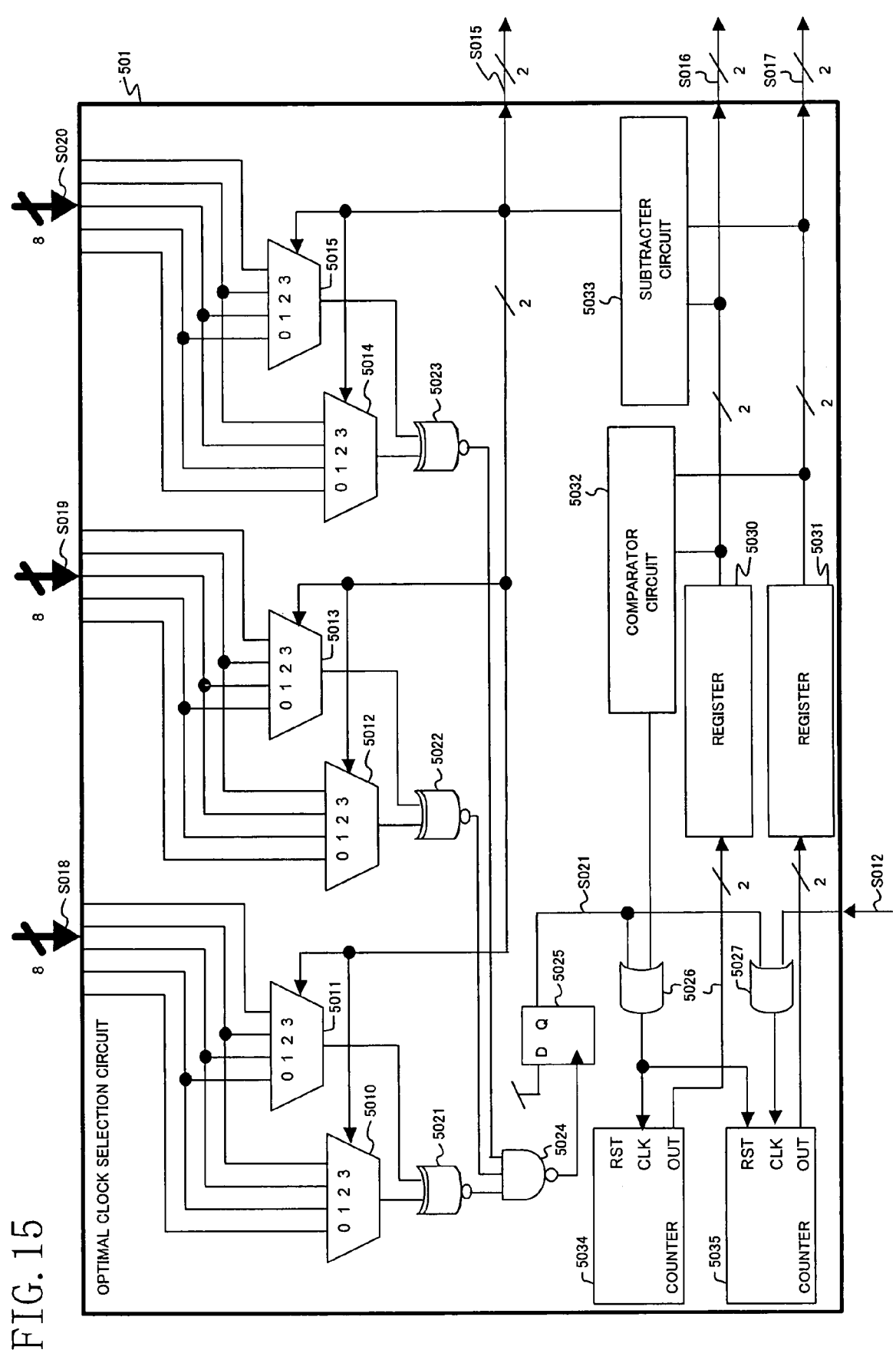
FIG. 15 is a block diagram showing an example of the structure of an optimal clock selection circuit 501.

In FIG. 15, selectors 5010, 5011 receive a sum S018 and select two consecutive bits of the sum S018 according to number-of-sampling-operations information S015. More specifically, when the number-of-sampling-operations information S015 is "00," the selector 5010 selects a second bit of the sum S018 and the selector 5011 selects a third bit of the sum S018. When the number-of-sampling-operations information S015 is "01," the selector 5010 selects a third bit of the sum S018 and the selector 5011 selects a fourth bit of the sum S018.

Similarly, selectors 5012, 5013 receive a sum S019 and select two consecutive bits of the sum S019 according to the number-of-sampling-operations information S015.

Selectors 5014, 5015 receive a sum S020 and select two consecutive bits of the sum S020 according to the number-of-sampling-operations information S015.

As shown in FIG. 15, EXNOR circuits 5021 through 5023, a NAND circuit 5024, and a flip-flop 5025 are connected to the selectors 5010 through 5015. Accordingly, the flip-flop 5025 outputs "1" when two inputs have the same value in all of the EXNOR circuits 5021 through 5023. Otherwise, the flip-flop 5025 outputs "0." The output of the flip-flop 5025 is herein referred to as a control signal S021.

A control signal S021 is applied to one input of an OR circuit 5026, and an output of a comparator circuit 5032 is applied to the other input of the OR circuit 5026. A control signal S021 is applied to one input of an OR circuit 5027, and a clock signal S012 is applied to the other input of the OR circuit 5027.

A register 5030 stores an output of a counter 5034. The value stored in the register 5030 is used by the clock divider circuit 402 as frequency information S016.

A register 5031 stores an output of a counter 5035. The value stored in the register 5031 is used by the clock divider circuit 402 as frequency information S017.

It should be noted that, in this embodiment, the clock divider circuit 402 is structured so that the frequency of the clock signal S012 is doubled as the frequency information S016 is reduced by one, and that the frequency of the clock signal S005 is doubled as the frequency information S017 is reduced by one.

The comparator circuit 5032 compares a value stored in the register 5030 with a value stored in the register 5031, and outputs "1" when the value of the register 5030 is smaller than the value of the register 5031.

The subtracter circuit 5033 performs a subtraction operation of the respective values of the registers 5030, 5031, and outputs the operation result as number-of-sampling-operations information S015.

The counters 5034, 5035 are 2-bit down counters.

When a control signal S021 is "0," the counter 5034 counts down from "11" to "00" in response to a rise of the output of the comparator circuit 5032.

When the control signal S021 is "0," the counter 5035 counts down from "11" and outputs a count value in response to a rise of the clock signal S012. When the count value becomes "00," the counter 5035 resets the count value to "11."

When the control signal S021 is "1," the counters 5034, 5035 stop counting. As a result, the value of the register 5031 is settled.

Hereinafter, operation of the A-D converter 500 will be described mainly in terms of operation of the optimum clock selection circuit 501. It is herein assumed that the control signal S014 is "00." When the control signal S014 is "00," majority operation is performed only on the least significant bit.

Figure 16:
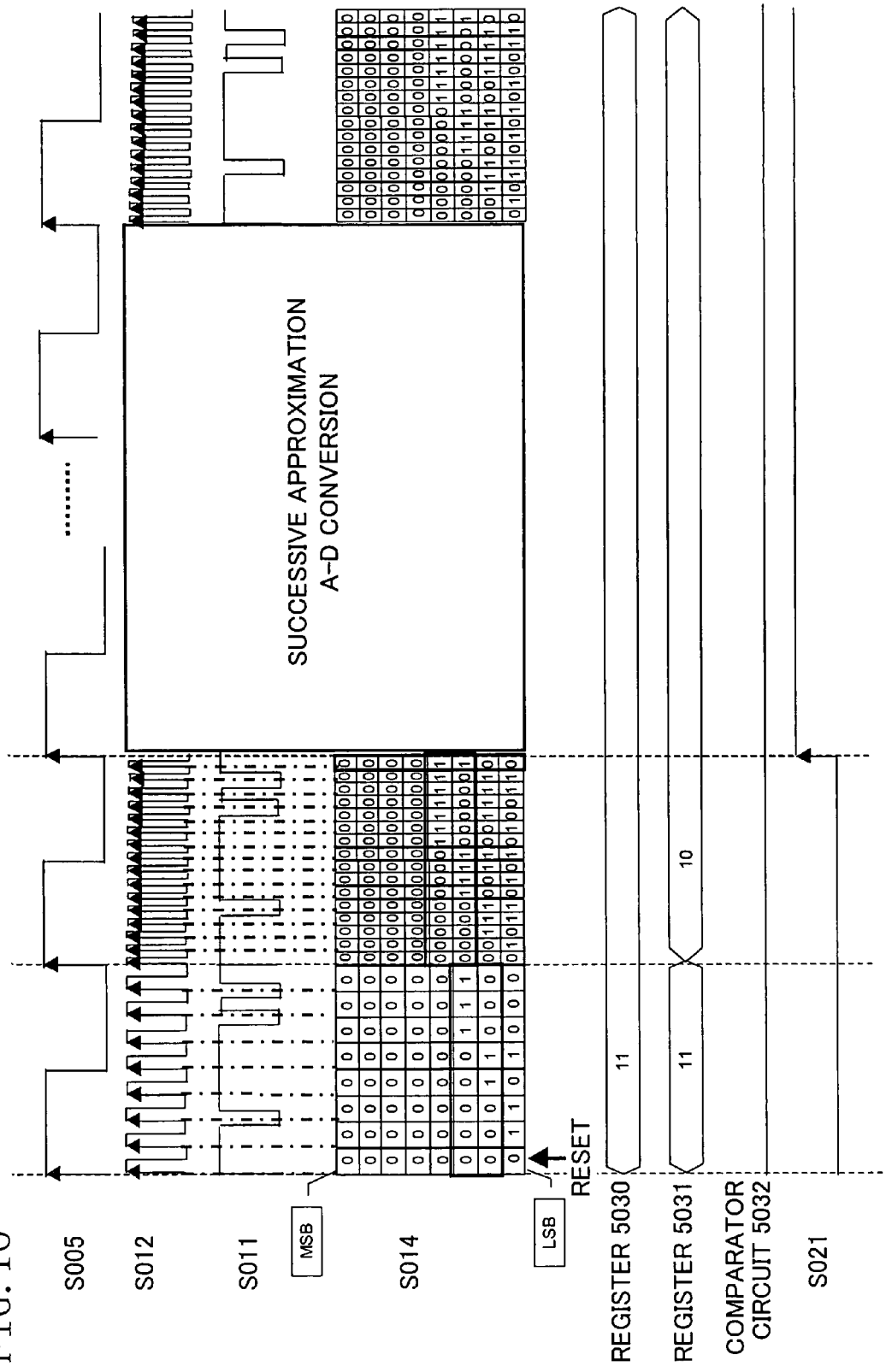
FIG. 16 is a waveform diagram of signals such as a clock signal S012 when a control signal S014 is "00"

FIG. 16 shows waveforms of signals such as a clock signal S012 when the control signal S014 is "00." The initial values of the registers 5030, 5031 are both "11." It is herein assumed that the ratio of the cycle of the clock signal S005 to the cycle of the clock signal S012 is 8 to 1. It should be noted that when the control signal S014 is "00," the selectors 5012 through 5015 always output "0," and the EXNOR circuits 5022, 5023 always outputs "1."

In the initial state described above, the number-of-sampling-operations information S015 that is output from the subtracter circuit 5033 is "0." Accordingly, the selectors 5010, 5011 output the second and third bits of the sum S018, respectively. It is herein assumed that when the number-of-sampling-operations information S015 is "0," the number of sampling operations to be conducted for majority operation in the majority circuit 403 (that is, the number of times the majority circuit 403 conducts a sampling operation for majority operation) is 8.

In the example of FIG. 16, the second and third bits of the sum S018 are "0" and "1,"respectively, at the eighth rise of the clock signal S012. In this case, the control signal S021 is "0." Since the output of the comparator circuit 5032 is "0," the counter 5034 does not count down. On the other hand, the counter 5035 counts down and the value of the register 5031 becomes "10."

When the value of the register 5031 changes, the frequency of the clock signal S012 is doubled. Accordingly, the ratio of the cycle of the clock signal S005 to the cycle of the clock signal S012 becomes 16 to 1. The number-of-sampling-operations information S015 that is output from the subtracter circuit 5033 changes from "0" to "1," and the number of sampling operations is changed accordingly. In this embodiment, it is assumed that the number of sampling operations is changed to 16.

In this state, for example, when the third bit of the sum S018 is "1" and the fourth bit of the sum S018 is "1" at the sixteenth rise of the clock signal S012, the control signal S021 rises to "1." Accordingly, the counter 5035 stops counting and the value of the register 5031 is settled to "10." Since the counter 5034 is not counting, the value of the register 5030 is settled to "11." By setting the clock signals as described above, the majority accounts for 12 or more of 16 samplings.

For example, if noise is periodic and sampling for majority operation is conducted according to the cycle of the noise, the difference between the number of times the bit is determined as "0" and the number of times the bit is determined as "1" may not become so large no matter how much the number of sampling operations is increased. In this case, it is considered that the majority operation result is not so reliable. In this embodiment, however, as described above, the clock frequency is controlled so that the majority accounts for a prescribed proportion or more. As a result, a stable majority operation result can be obtained.

Sixth Embodiment

In a sixth embodiment, an analog-to-digital (A-D) converter capable of automatically setting an optimal number of sampling operations to be conducted for majority operation (a sufficient number of sampling operations to obtain an accurate A-D conversion result) will be described.

Figure 17:
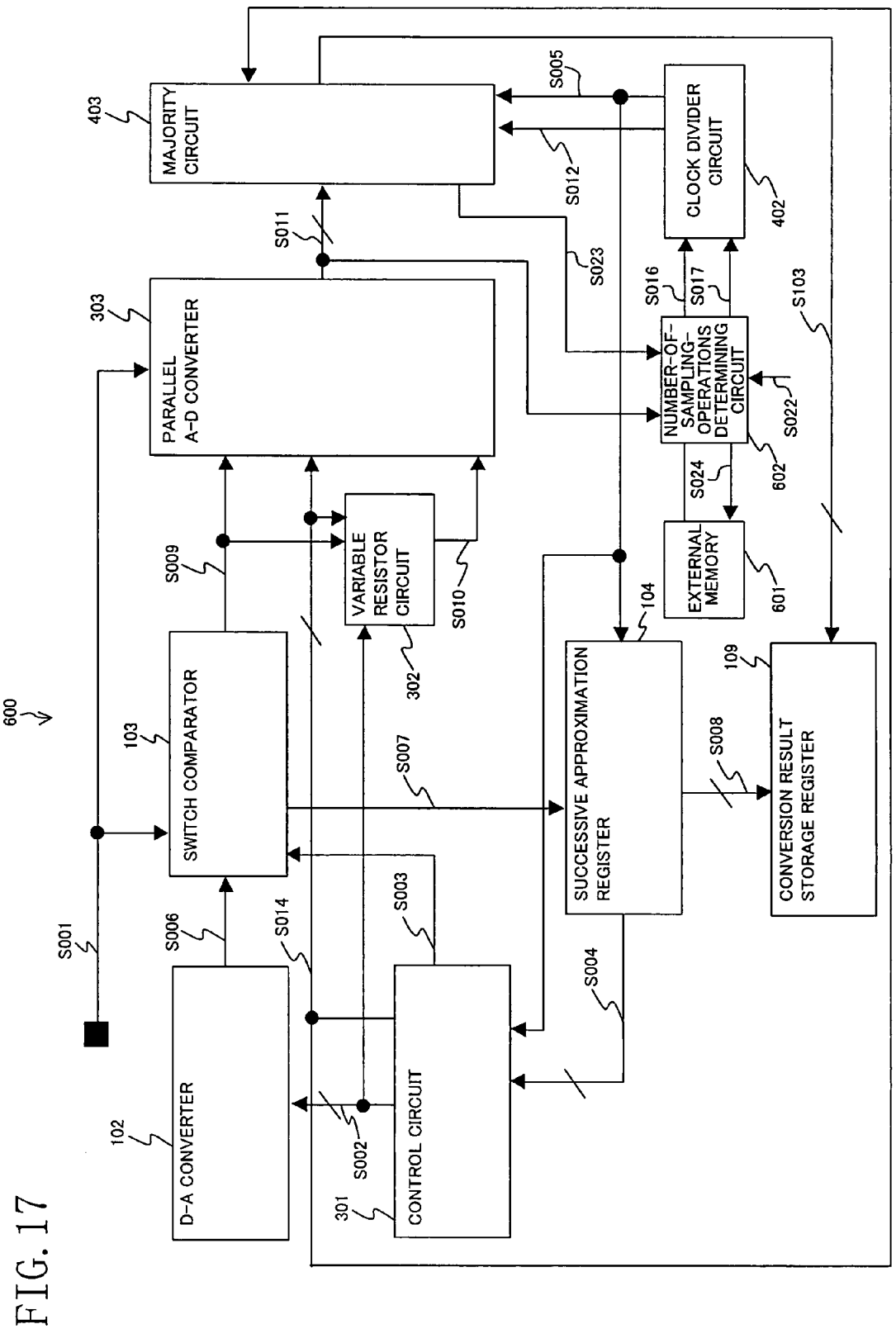
FIG. 17 is a block diagram showing the structure of an A-D converter according to a sixth embodiment of the invention.

FIG. 17 is a block diagram showing the structure of an A-D converter 600 according to the sixth embodiment of the invention. As shown in FIG. 17, the A-D converter 600 is the same as the A-D converter 500 except that an external memory 601 is added and that the optimal clock selection circuit 501 is replaced with a number-of-sampling-operations determining circuit 602. The A-D converter 600 has two operation modes: an evaluation mode and a product mode. In the evaluation mode, the A-D converter 600 determines an optimal number of sampling operations. In the product mode, the A-D converter 600 actually conducts A-D conversion using the number of sampling operations determined in the evaluation mode. Hereinafter, the elements that are additionally provided in the A-D converter 600 will be described.

The external memory 601 stores data (described below) that is output from the number-of-sampling-operations determining circuit 602.

Figure 18:
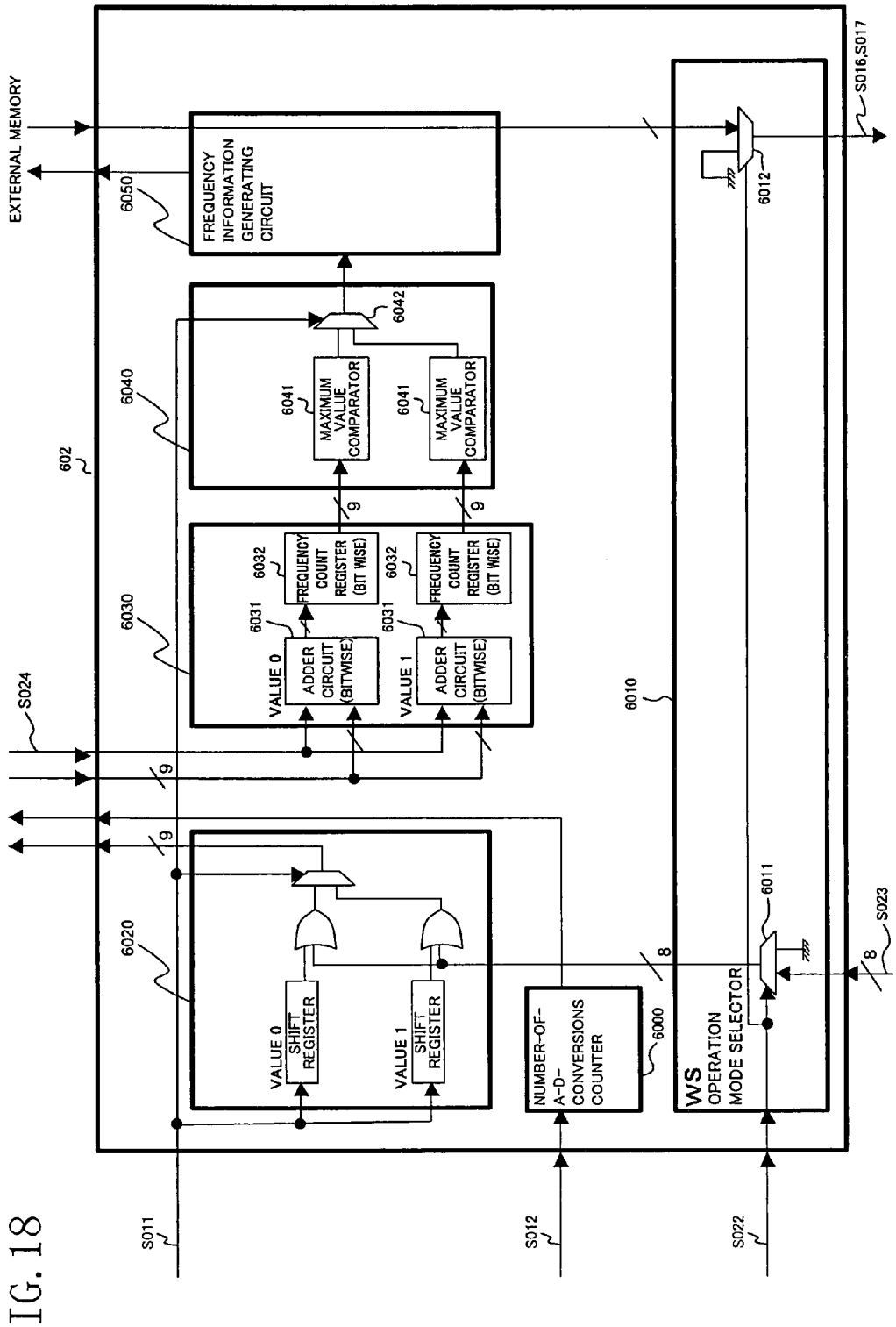
FIG. 18 is a block diagram showing an example of the structure of a number-of-sampling-operations determining circuit 602.

The number-of-sampling-operations determining circuit 602 determines the frequency of the clock signal S012 and the frequency of the clock signal S005 (that is, an optimal number of sampling operations to be conducted for majority operation). For example, the number-of-sampling-operations determining circuit 602 may be formed as shown in FIG. 18. In the example of FIG. 18, the number-of-sampling-operations determining circuit 602 includes a number-of-A-D-conversions counter 6000, an operation mode selector 6010, a majority information transfer circuit 6020, a frequency information generating circuit 6030, a highest occurrence frequency selector 6040, and a frequency information generating circuit 6050.

(Number-of-A-D-Conversions Counter 6000)

The number-of-A-D-conversions counter 6000 counts the number of A-D conversions in response to a clock signal S012. The number of A-D conversions herein refers to the number of times a final A-D conversion result was output.

(Operation Mode Selector 6010)

The operation mode selector 6010 controls data communication with the external memory 601 and the clock divider circuit 402 according to the operation mode. More specifically, the operation mode selector 6010 includes selectors 6011, 6012. The selectors 6011, 6012 are controlled by an operation mode selection signal S022 (described below). The selector 6011 receives majority information S023. The majority information S023 is a data group of "0" and "1" which is used for majority operation in the majority circuit 403. For example, when sampling is conducted seven times for majority operation (that is, when the number of sampling operations to be conducted for majority operation is seven), the majority information S023 is data of seven sampling results for a prescribed bit of the digital signal S011. In this embodiment, the majority information S023 is 8-bit data. The operation mode selection signal S022 is a signal that shows whether the operation mode of the A-D converter 600 is an evaluation mode or a product mode.

When the operation mode selection signal S022 shows that the A-D converter 600 is in the evaluation mode, the operation mode selector 6010 outputs the majority information S023 to the majority information transfer circuit 6020. When the operation mode selection signal S022 shows that the A-D converter 600 is in the product mode, the operation mode selector 6010 reads the frequency information S016 and the frequency information S017 from the external memory 601 and outputs the frequency information S016, S017 to the clock divider circuit 402, as described below.

(Majority Information Transfer Circuit 6020)

The majority information transfer circuit 6020 performs a bit shift operation on a digital signal S011, and performs an OR operation of the data resulting from the bit shift operation and the majority information S023 to produce one piece of data (conversion result/majority information S024). The majority information transfer circuit 6020 stores the conversion result/majority information S024 in the external memory 601 by using a count value of the number-of-A-D-conversions counter 6000 as address information. It should be noted that, in this embodiment, the conversion result/majority information S024 is 9-bit data.

(Frequency Information Generating Circuit 6030)

The frequency information generating circuit 6030 includes two adder circuits 6031 and two frequency count registers 6032. One of the adder circuits 6031 reads data from the external memory 601, and obtains, for each bit that was determined as "1" in each A-D conversion, the number of times the majority circuit 403 sampled that bit as "1" in majority operation. In other words, this adder circuit 6031 obtains the frequency of data "1." The other adder circuit 6031 obtains, for each bit that was determined as "0," the number of times the majority circuit 403 sampled that bit as "0" in majority operation. In other words, this adder circuit 6031 obtains the frequency of data "0."

Each frequency count register 6032 stores an output of a corresponding adder circuit 6031.

(Highest Occurrence Frequency Selector 6040)

The highest occurrence frequency selector 6040 obtains the highest one of the data frequencies obtained by the frequency information generating circuit 6030. The highest occurrence frequency selector 6040 includes two maximum value comparators 6041 and a selector 6042.

Each maximum value comparator 6041 obtains the highest one of the data frequencies stored in a corresponding frequency count register 6032.

The selector 6042 selects one of the two maximum value comparators 6041 according to the digital signal S011. The output of the selector 6042 is herein referred to as a highest occurrence frequency.

(Frequency Information Generating Circuit 6050)

The frequency information generating circuit 6050 obtains the minimum number of sampling operations required for majority operation, based on the highest occurrence frequency for data "1" and the largest occurrence frequency for data "0." The frequency information generating circuit 6050 generates frequency information S016 and frequency information S017 according to the obtained number of sampling operations, and outputs the frequency information S016 and the frequency information S017 to the external memory 601.

(Operation of the A-D Converter 600)

When the operation mode selection signal S022 indicates that the A-D converter 600 is in the evaluation mode, the operation mode selector 6010 outputs majority information S023 to the majority information transfer circuit 6020. Accordingly, the majority information transfer circuit 6020 generates conversion result/majority information S024 and stores the conversion result/majority information S024 in the external memory 601. Based on the conversion result/majority information S024 stored in the external memory 601, the frequency information generating circuit 6030 obtains a frequency of data for each A-D conversion, and the highest occurrence frequency selector 6040 obtains the highest occurrence frequency from the data frequencies obtained by the frequency information generating circuit 6030. Based on the highest occurrence frequency, the frequency information generating circuit 6050 generates frequency information S016 and frequency information S017 and outputs the frequency information S016 and the frequency information S017 to the external memory 601.

When the operation mode selection signal S022 indicates that the A-D converter 600 is in the product mode, the operation mode selector 6010 reads the frequency information S016 and the frequency information S017 from the external memory 601, and outputs the frequency information S016 and the frequency information S017 to the clock divider circuit 402. The number of sampling operations to be conducted for majority operation in the majority circuit 403 is thus determined.

As described above, in this embodiment, data frequencies are statistically obtained and an optimal number of sampling operations to be conducted for majority operation is determined in the evaluation mode. Accordingly, no unnecessary sampling operation is conducted for majority operation, whereby the A-D conversion speed can be improved over the other embodiments.

It should be noted that each of the above embodiments uses a successive approximation A-D converter for A-D conversion of upper bits, and uses a parallel A-D converter for A-D conversion of lower bits. However, this is by way of example only, and the types of A-D converters are not limited to this example.

As has been described above, the A-D converter of the invention uses majority operation to determine an output of lower bits that are susceptible to noise. Therefore, even when noise is generated within the A-D converter, A-D conversion can be conducted without degrading accuracy. Therefore, the invention is useful as, e.g., an A-D converter for outputting a digital signal corresponding to an analog signal.

What is claimed is:

1. An analog-digital (A-D) converter for outputting a digital signal corresponding to an analog input signal, comprising:
    an upper bit A-D converting section for conducting A-D conversion of the analog input signal and outputting an upper bit portion of the digital signal;
    a lower bit A-D converting section for conducting A-D conversion of the analog input signal and outputting a lower bit portion of the digital signal;
    a majority circuit for sampling an A-D conversion result of the lower bit A-D converting section a plurality of times and determining a value of each of the lower bits by majority operation; and
    a variable resistor circuit having a resistance value varying according to digital data for producing a reference voltage, the digital data for producing a reference voltage being produced by adding lower bits having a value "1" to the upper bits, wherein
    the variable resistor circuit divides a voltage obtained by D-A conversion of the digital data for producing a reference voltage, and
    the lower bit A-D converting section uses the voltage output from the variable resistor circuit as a reference voltage.

2. The A-D converter according to claim 1, wherein the lower bit A-D converting section is capable of varying a bit length of the lower bits.

3. The A-D converter according to claim 1, wherein the majority circuit is capable of varying the number of sampling operations.

4. The A-D converter according to claim 3, wherein the majority circuit varies the number of sampling operations according to a cycle of noise.

5. The A-D converter according to claim 3, further comprising a number-of-sampling-operations determining circuit for obtaining respective frequencies of "1" and "0" sampled in majority operation, and controlling the number of sampling operations of the majority circuit according to the frequencies.

* * * * *